(12) United States Patent
Menon et al.

(10) Patent No.: US 12,376,333 B2
(45) Date of Patent: Jul. 29, 2025

(54) CONFIGURABLE LOW OHMIC POWER CIRCUITS

(71) Applicant: SEMICONDUCTOR COMPONENTS INDUSTRIES, LLC, Phoenix, AZ (US)

(72) Inventors: Santosh Menon, Portland, OR (US); Radim Spetik, Roznov pod Radhostem (CZ); Bruce Blair Greenwood, Gresham, OR (US); Robert Davis, Cranston, RI (US); Ladislav Seliga, Francova Lhota (CZ); Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 463 days.

(21) Appl. No.: 17/663,331

(22) Filed: May 13, 2022

(65) Prior Publication Data
US 2023/0369485 A1 Nov. 16, 2023

(51) Int. Cl.
| | |
|---|---|
| H10D 30/66 | (2025.01) |
| H01L 21/768 | (2006.01) |
| H01L 23/64 | (2006.01) |
| H10D 30/01 | (2025.01) |
| H10D 64/00 | (2025.01) |
| H10D 64/27 | (2025.01) |

(52) U.S. Cl.
CPC ..... *H10D 30/668* (2025.01); *H01L 21/76877* (2013.01); *H01L 23/647* (2013.01); *H10D 30/0297* (2025.01); *H10D 64/118* (2025.01); *H10D 64/516* (2025.01)

(58) Field of Classification Search
None
See application file for complete search history.

(56) References Cited

U.S. PATENT DOCUMENTS

| | | |
|---|---|---|
| 2005/0242369 A1 | 11/2005 | Udrea et al. |
| 2011/0006361 A1 | 1/2011 | Dawish et al. |
| 2011/0068387 A1 | 3/2011 | Kitamura |
| 2012/0256250 A1 | 10/2012 | Schulze et al. |
| 2013/0105968 A1 | 5/2013 | Lu et al. |
| 2018/0019259 A1* | 1/2018 | Hall .................. H01L 21/76895 |

\* cited by examiner

*Primary Examiner* — Anthony Ho
(74) *Attorney, Agent, or Firm* — Brake Hughes Bellermann LLP

(57) ABSTRACT

A method includes forming a plurality of pockets of semiconductor material in a semiconductor substrate. The plurality of pockets are electrically isolated from the semiconductor substrate. The method further involves forming a metal-oxide-semiconductor field-effect transistor (MOSFET) in a pocket of the plurality of pockets, the MOSFET being a vertical trench shielded gate MOSFET. The method further includes forming an electrical connection to a drain region of the MOSFET vertically below a trench and a mesa of the MOSFET.

20 Claims, 25 Drawing Sheets

600

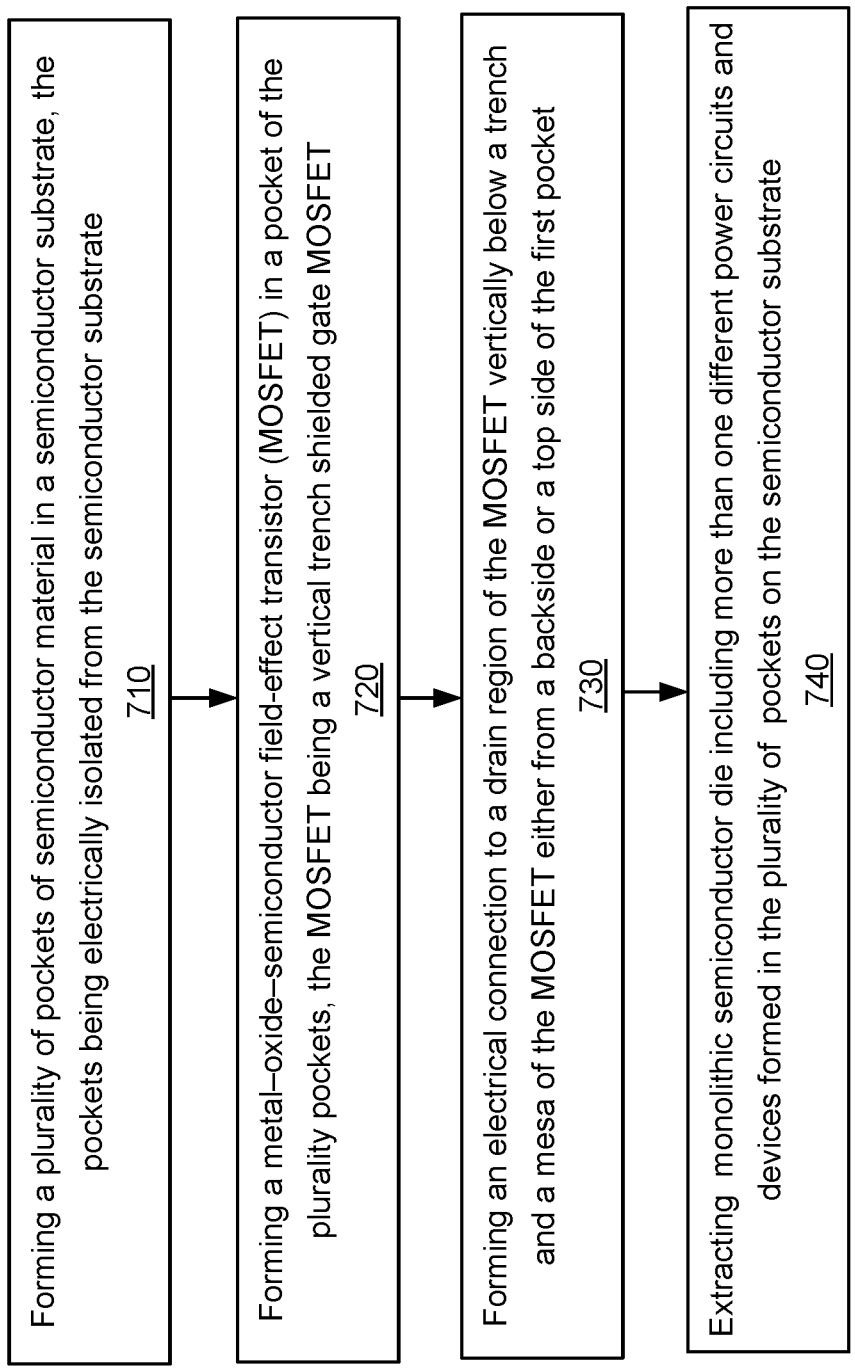

CONFIGURABLE LOW OHMIC POWER CIRCUITS

TECHNICAL FIELD

This description relates to power devices and circuits.

BACKGROUND

Modern high-power devices can be fabricated on semiconductor die using advanced semiconductor technology to meet high power requirements. These high-power devices (e.g., silicon power devices such as a metal-oxide-semiconductor field effect transistor (MOSFET), an insulated-gate bipolar transistor (IGBT), a fast recovery diode (FRD), etc.) are configured (i.e., used) in power supplies and circuits, for example, as drivers (e.g., H-bridge, high-side/low-side drivers) or switches. The power supplies and circuits are often assembled by interconnecting multiple semiconductor die. The interconnections between multiple semiconductor die can have high ohmic resistances affecting performance.

SUMMARY

In a general aspect, a method includes forming a plurality of pockets of semiconductor material in a semiconductor substrate. The plurality of pockets are electrically isolated from the semiconductor substrate. The method further involves forming a metal-oxide-semiconductor field-effect transistor (MOSFET) in a pocket of the plurality of pockets, the MOSFET being a vertical trench shielded gate MOSFET. The method further includes forming an electrical connection to a drain region of the MOSFET vertically below a trench and a mesa of the MOSFET.

In a general aspect, a semiconductor die includes a semiconductor material layer having a top surface and a backside surface, an insulating dielectric layer disposed on the backside surface of the semiconductor material layer, and a plurality of insulator-filled trenches extending vertically through a thickness of the semiconductor material layer from the top surface to the insulating dielectric layer disposed on the backside surface of the semiconductor material layer. The plurality of insulator-filled trenches partition the semiconductor material layer into a plurality of pockets and define sidewalls of the plurality of pockets. The semiconductor die further includes at least one device formed in at least one of the plurality of pockets including a vertical trench metal-oxide semiconductor field effect transistor (MOSFET). The vertical trench MOSFET has a backside contact to a drain region of the vertical trench MOSFET.

In a general aspect, a semiconductor die includes a semiconductor material layer having a top surface and a bottom surface. The semiconductor material layer includes a p− doped semiconductor layer disposed on or at the bottom surface, a N+ doped layer disposed on the p− doped semiconductor layer, and an epitaxial layer with n− type dopants disposed on the N+ doped layer. The semiconductor die further includes an insulating layer disposed underneath the p− doped semiconductor layer on or at the bottom surface of the semiconductor material layer, and a plurality of insulator-filled trenches extending vertically down through a thickness of the semiconductor material layer from the top surface to the p− doped semiconductor layer disposed on or at the bottom surface of the semiconductor material layer. The plurality of insulator-filled trenches partition the semiconductor material layer into a plurality of pockets, form sidewalls of the plurality of pockets and electrically isolate the plurality of pockets from each other in directions normal to the sidewalls. The plurality of pockets are electrically connected to each other by the p− doped semiconductor layer disposed on or at the bottom surface of the semiconductor material layer.

The semiconductor die further includes at least one device formed in at least one of the plurality of pockets including a vertical trench MOSFET having a backside contact to a drain region.

In a general aspect, a semiconductor die includes a semiconductor material layer formed in an epitaxial layer on a substrate of a first conductive type. The semiconductor material layer has a top surface and a bottom surface.

The semiconductor die further includes a buried conductive layer of a second conductive type disposed on or at about the bottom surface of the semiconductor material layer, and a plurality of insulator-filled trenches extending vertically down from the top surface to the bottom surface of the semiconductor material layer below the buried conductive layer of the second conductive type. The plurality of insulator-filled trenches partition the semiconductor material layer into a plurality of pockets, form sidewalls of the plurality of pockets and electrically isolate the plurality of pockets from each other in directions normal to the sidewalls. The plurality of pockets are electrically isolated from the substrate of the first conductive type in vertical directions by a p-n junction formed between the buried conductive layer of the second conductive type and the substrate of the first conductive type.

The semiconductor die further includes a vertical trench MOSFET in a pocket from the plurality of pockets, a backside through-silicon via (BTSV) extending from a backside of the substrate of the first conductive type into the pocket, and a backside contact through the BTSV to a drain region of the vertical trench MOSFET in the pocket.

The details of one or more implementations are set forth in the accompanying drawings and the description below. Other features will be apparent from the description and drawings, and from the claims.

BRIEF DESCRIPTION OF THE DRAWINGS

FIG. 7 illustrates an example method for integrating diverse power circuits and devices in a single monolithic semiconductor die.

DETAILED DESCRIPTION

Figure 1:
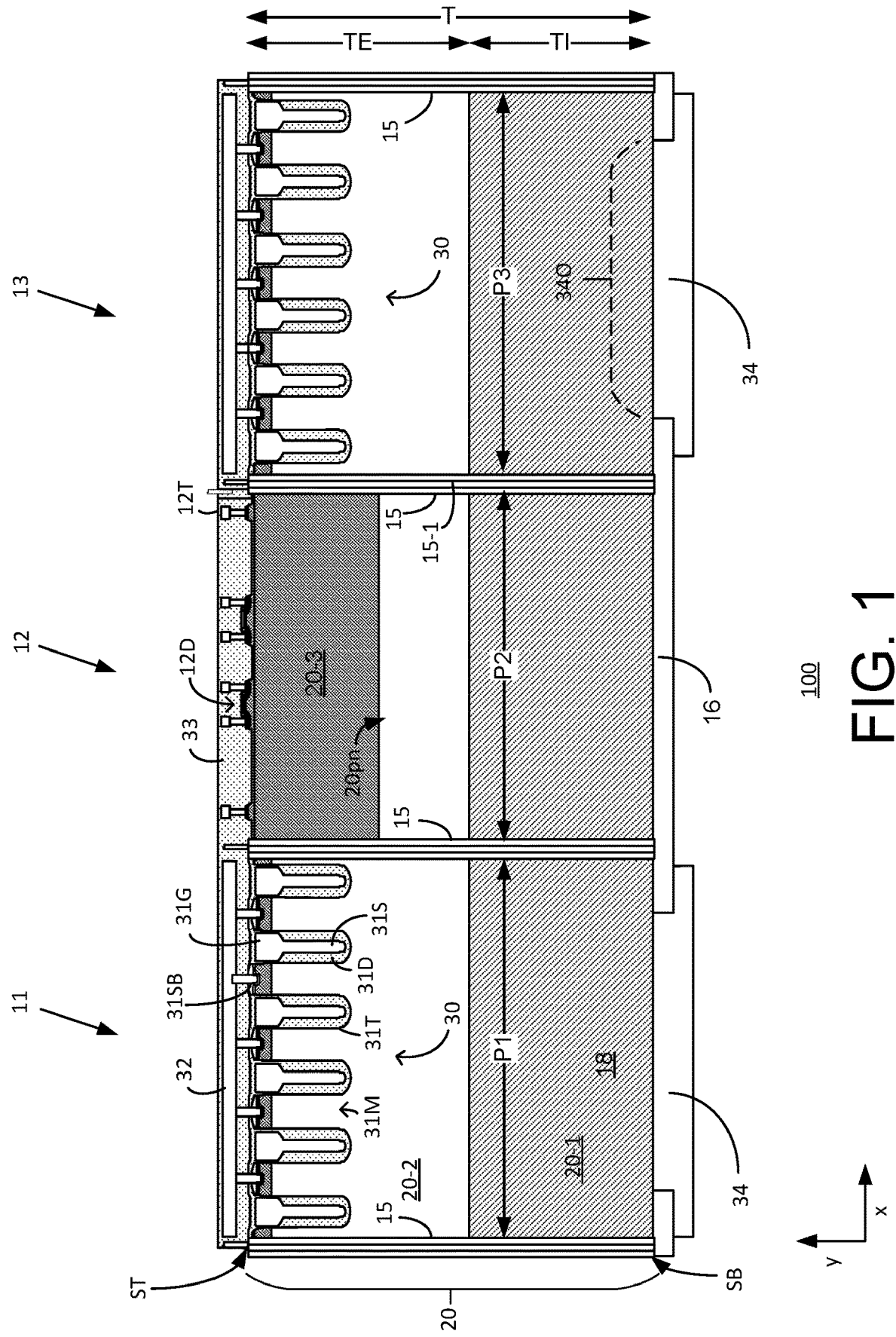
FIG. 1 illustrates a cross-sectional view of an example monolithic semiconductor die.

Modern high-power semiconductor devices (e.g., metal-oxide-semiconductor field-effect transistors (MOSFETs)) and can be fabricated using advanced semiconductor technologies to meet the high power requirements. The power devices (e.g., an insulated-gate bipolar transistor (IGBT), a fast recovery diode (FRD), etc.) may be fabricated as individual semiconductor die using, for example, one or more of silicon (Si), silicon carbide (SiC), and gallium nitride (GaN) materials, or other semiconductor materials. Multiple power devices may be interconnected (e.g., wire connected) as discrete elements (e.g., as switches, bridges, sensing circuits, protection circuits, and convertors, etc.) in power supplies and circuits. The multiple wire connections may result in parasitic impedances (e.g., capacitance, resistance, etc.) that can degrade performance of the power supplies and circuits.

Configurable architectures for monolithic power circuits and devices with improved performance (e.g., with reduced specific resistance (Rsp)) are disclosed herein. In accordance with the principles of the present disclosure, for improved performance in many applications, a monolithic power circuit may be fabricated as a single monolithic integrated circuit chip (IC) or semiconductor die with several circuits or circuit elements (i.e., high-side/low-side drivers, controllers, etc.) incorporated in the single die. Each of the several of circuits incorporated in the single semiconductor die may be electrically isolated from each of the several other circuits incorporated in the single semiconductor die.

In some implementations, a circuit or device in the single semiconductor die may have electrical contacts or terminals disposed on a top side of the die (i.e., have a top side contact topology). In some implementations, a circuit or device in the single semiconductor die may have electrical contacts or terminals disposed on the backside of the die (i.e., have a backside contact topology). The top side of the die or substrate may refer to the side of the die or substrate on which trenches of the circuit or device are etched. The backside side of the die or substrate may refer to the side of the die or substrate opposite the side on which the trenches of the circuit or device are etched. Some of the devices (e.g., MOSFETS) used in the monolithic power circuits may have a drain-down architecture (in other words, drains of vertical trench shielded gate MOSFET devices in a monolithic power circuit may be on a bottom side (i.e., backside) of the monolithic semiconductor die). Elements or components of a monolithic power circuit may include one or more of high-side, low-side and mixed topology circuits (e.g., Smart-FETs, half bridge, full bridge, e-fuse, etc.) and a controller. In some implementations, the circuit elements (e.g., MOSFET circuits) included in a monolithic semiconductor die may, for example, include circuits with backside contact topologies (e.g., MOSFET circuits with a backside drain contact topology). In some implementations, the circuit elements (e.g., MOSFET circuits) included in a monolithic semiconductor die may, for example, include circuits with top side contact topologies (e.g., MOSFET circuits with a top side drain contact topology). In some implementations, the circuit elements (e.g., MOSFET circuits) included in a monolithic semiconductor die may, for example, include some MOSFET circuits with a backside drain contact topology and other MOSFET circuits with a top side drain contact topology.

Based on application requirements, a monolithic semiconductor die may be configured to have an arrangement of isolated circuits or devices with different contact topologies (e.g., top side contact topology, backside side contact topology) fabricated in distinct pockets of semiconductor material in the die. The pockets may be small three-dimensional containers, compartments, cells, or enclosures of semiconductor material in the die. The pockets may be walled off or partitioned from each other (e.g., by trenches) so that the semiconductor material in one pocket does not overlap with the semiconductor material in another pocket.

In example implementations, for a top side contact device, the vertical dimensions (e.g., in a y direction) of a pocket may, for example, be in a range of about 1 µm to about 50 µm. For a backside contact device, the vertical dimensions of a pocket may, for example, be in a range of about 25 µm to about 350 µm. The pocket may extend through an entire thickness or a substantial portion of the entire thickness of the semiconductor substrate.

For both top side contact and backside contact devices, the lateral dimensions (e.g., in x and z directions) of a pocket may, for example, be in a range of a few microns to tens of microns for small devices but can be in a range of hundreds or even thousands of microns for a large power semiconductor device or for a large group of devices.

In example implementations the monolithic semiconductor die may be fabricated using complementary metal oxide semiconductor (CMOS) process technology or a combination of bipolar, CMOS and double diffused metal oxide semiconductor (BCD) process technologies. These process technologies can enable inclusion of fully isolated devices (e.g., N-type and/or P-type trench and lateral MOSFET devices, and BiCMOS, PMOS, NMOS and DMOS devices, etc.) having ultra-low specific on-resistance (Rsp) in the monolithic semiconductor die.

In example implementations, a monolithic semiconductor die (e.g., monolithic semiconductor die 100, FIG. 1) may include semiconductor material layer (e.g., layer 20, FIG. 1) that is divided or partitioned into one or more isolated semiconductor regions (tubs or pockets) (e.g., pockets P1, P2, P3, etc., FIG. 1) by deep trench isolation (DTI) (in other words, by insulator-filled trenches 15) extending across a thickness T of the semiconductor material layer (e.g., layer 20, FIG. 1). In example implementations, the trenches may have depths in a range of a few microns to several tens of microns (e.g., 2.0-50 microns deep). In example implementations, the monolithic semiconductor die may include one or more circuits (e.g., a high-side driver circuit, a low-side driver circuit, a controller, a protection circuit, and/or a sensing circuit, etc.) that are fabricated in respective isolated tubs or pockets and are electrically isolated from each other.

In an example implementation shown in FIG. 1, an example monolithic semiconductor die may include a high-side driver circuit, a controller, and a low-side driver circuit that are fully isolated from each other, and the devices (e.g., MOSFETs) in the high-side driver circuit and the low-side driver circuit can have a backside drain contact topology. In an example implementation, the devices (e.g., MOSFETs) in the high side driver circuit and the low-side driver circuit can share a common backside drain connection (e.g., to ground).

FIG. 1 shows a cross-sectional view (in a x-y plane) of an example monolithic semiconductor die 100. The x direction (i.e., x axis) may be referred to as the vertical direction or axis, and the y direction (i.e., y axis) may be referred to as the horizontal direction or axis. In example implementations, monolithic semiconductor die 100 may be fabricated, for example, on a silicon-on-insulator (SOI) semiconductor wafer (as will be discussed later below with reference to FIGS. 5A-5H). The semiconductor die 100 may have a thickness T (e.g., in a vertical y direction) between a top surface (e.g., top surface ST) and a backside or bottom surface (e.g., bottom surface SB) of the die. Thickness T may correspond, for example, to a thickness of a silicon overlayer (e.g., silicon material layer 20) of the SOI semiconductor wafer. The thickness T of the silicon overlayer (e.g., silicon material layer 20) may include a thickness TI of a heavily doped silicon overlayer (e.g., silicon material layer 20-1) of a starting SOI semiconductor wafer and a thicknesses TE of further lightly doped or undoped epitaxial silicon layers (e.g., epi layers 20-2, 20-3) grown on the starting SOI semiconductor wafer (FIGS. 5A-5H). In example implementations, the silicon overlayer (e.g., silicon material layer 20-1) of the starting SOI semiconductor wafer may, for example, be a heavily doped silicon material layer (e.g., a N+ doped layer with dopant concentrations in a range of about ~10E19 to 10E21). Epi layer 20-2 may be doped with dopants of a second conductive type (e.g., n-type dopants) and epi layer 20-3 may be doped with dopants of a first conductive type (e.g., p-type dopants) (using, for example, ion implantation and or diffusion techniques).

Monolithic semiconductor die 100 may, for example, include a high-side driver circuit 11, a controller circuit 12, and a low-side driver circuit 13 fabricated in isolated pockets (e.g., pockets P1, P2 and P3, respectively) in semiconductor material layer 20. Each of the these circuits may be isolated from adjacent circuits in the horizontal x direction (e.g., high-side driver circuit 11 from the adjacent controller circuit 12, and controller circuit 12 from the adjacent low-side driver circuit 13) by deep trench isolation (in other words, by insulator-filled deep trenches (e.g., deep trenches 15 that are filled with insulator 15-1)). Deep trenches 15 filled with insulator 15-1 (e.g., an oxide or undoped poly) may extend from top surface ST through thickness T to bottom surface SB of monolithic semiconductor die 100. Bottom surface SB of monolithic semiconductor die 100 may include (or at least in part be covered) by an insulating layer (e.g., oxide layer 16). Deep trenches 15 may extend from top surface ST through thickness T to reach the insulating layer (e.g., oxide layer 16) disposed on the bottom surface SB of monolithic semiconductor die 100.

In example implementations when monolithic semiconductor die 100 is fabricated, for example, on a SOI semiconductor wafer, oxide layer 16 may include at least a portion of the buried oxide (BOX) layer of the SOI semiconductor wafer. Bottom surface SB of monolithic semiconductor die 100 (and of silicon layer 20) may correspond to an interface of the buried oxide (BOX) layer of the SOI semiconductor wafer (FIGS. 5A-5H).

Pockets P1, P2 and P3 (i.e., silicon material layer 20 in the pockets) are electrically isolated from each other by the vertical insulator-filled deep trenches (trenches 15), for example, in directions normal to the vertical sidewalls of pockets, and by oxide layer 16 on the bottom side of the pockets, for example, in directions normal to bottom surfaces of the pockets.

In addition a p-n junction (e.g., p-n junction 21pn) that may form, for example, between epi layers 20-3 and 20-2 may serve to isolate controller circuit 12 from other portions of semiconductor region 20 in pocket P2.

Controller circuit 12, which is isolated from high-side driver circuit 11 and the low-side driver circuit 13 by deep trench 15, may include circuit devices and components (e.g., devices 12D, terminals 12T). These circuit devices and components may, for example, include NMOS and/or PMOS devices, and may be fabricated, for example, using CMOS or BCD technology fabricated on or in p-type epi-layer 20-3 at top surface ST.

In example implementations, high-side driver circuit 11 and low-side driver circuit 13 fabricated in pockets P1 and P2 (that may be doped with n-type dopants) may include one or more MOSFET devices (e.g., MOSFET 30). MOSFET 30 as shown, for example, in FIG. 1, may be a n-type vertical trench shielded gate MOSFET device with device elements formed in a plurality of vertical trenches and mesas (e.g., trenches 31T and mesas 31M). FIG. 1 shows, for example, gate poly 31G and shield poly 31S of MOSFET 30 disposed in trench 31T filled with an insulating dielectric 31D, and source and body regions (regions 31SB) of the MOSFET device formed in mesas 31M. The heavily doped silicon layer 20-1 vertically below (e.g., down below) or underneath trenches 31T (in the y direction) may include or form a drain region 18 of the device.

The source and body regions 31SB of the device may be connected to a source terminal (e.g., source conductor 32) on top surface ST of monolithic semiconductor die 100.

A passivating material layer (e.g. layer 33) may be disposed on top surface ST of monolithic semiconductor die 100 across the tops of high-side driver circuit 11, controller circuit 12, and low-side driver circuit 13 to protect and isolate the MOSFET devices (e.g., MOSFET 30) and controller circuit devices (e.g., device 12D) from the environment.

Further, drain region 18 of each of the MOSFET devices (in high-side driver circuit 11 and low-side driver circuit 13) may be connected through openings (e.g., opening 34O) in oxide layer 16 on bottom surface SB of monolithic semiconductor die 100 to a drain terminal (e.g., drain conductor 34). Thus, monolithic semiconductor die 100 includes MOSFETS 30 of the high-side driver circuit 11 and the low-side driver circuit 13 configured in a backside drain contact topology.

As noted earlier, the monolithic semiconductor die 100 shown in FIG. 1 may be fabricated on an SOI wafer. The high-side driver circuit 11, controller circuit 12, and low-side driver circuit 13 are formed in pockets P1, P2 and P3 that are fully isolated from each other by deep trenches 15 and by oxide layer 16 on bottom surface SB of monolithic semiconductor die 100. Further, the backside drain connections are fully isolated from the substrate (e.g., by oxide layer 16).

In other example implementations, the monolithic semiconductor die may involve different schemes for backside contact than the scheme shown in FIG. 1 for monolithic semiconductor die 100 fabricated on a SOI wafer.

Figure 2:
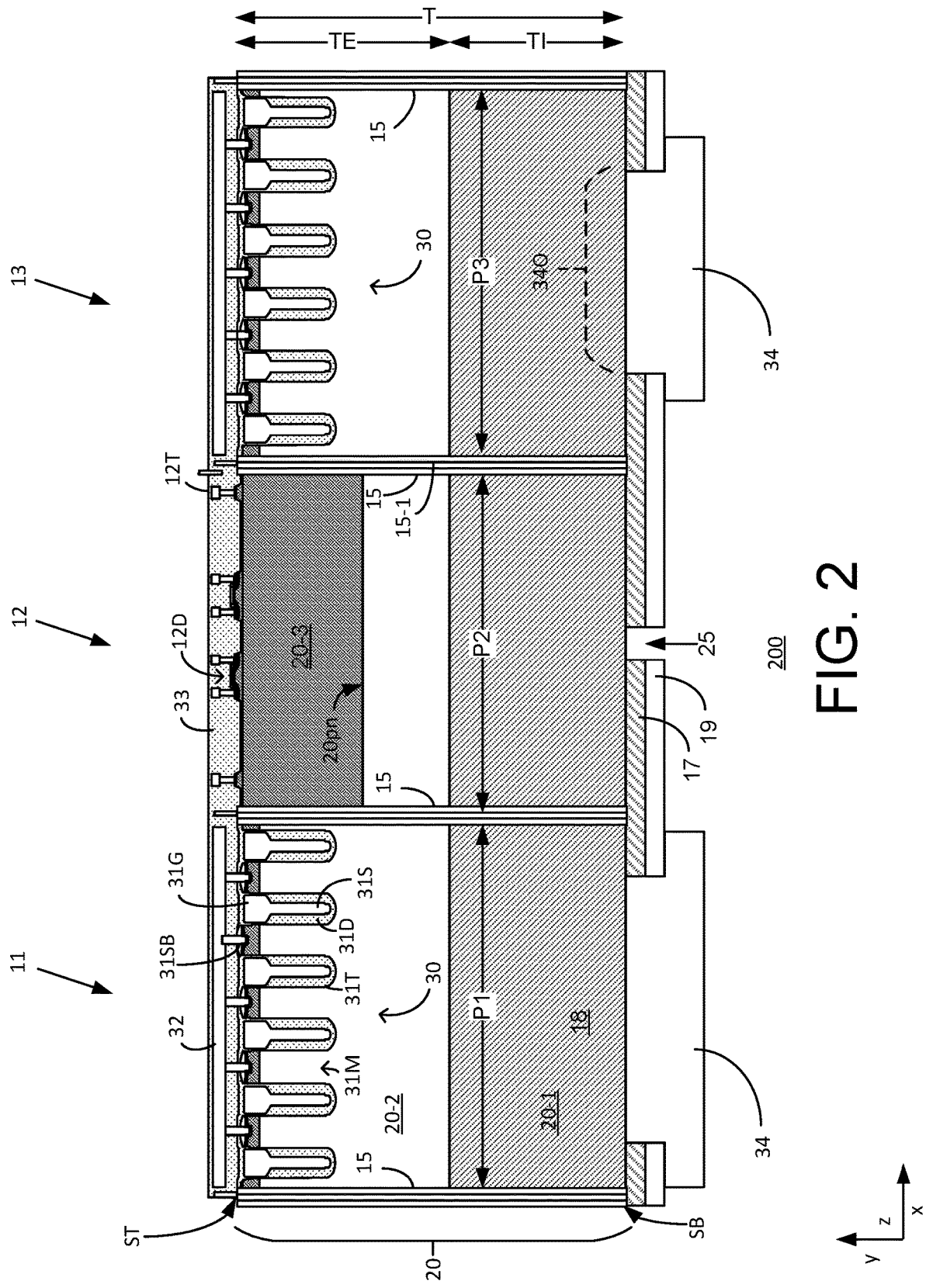
FIG. 2 illustrates a cross-sectional view another example monolithic semiconductor die.

FIG. 2 shows an example monolithic semiconductor die 200 having a backside drain contact topology. In monolithic semiconductor die 200, pockets P1, P2, P3, while being isolated in the horizontal x direction from each other by vertical deep trench isolation, may not fully isolated from each other along the backside of the die (i.e., along surface SB).

Monolithic semiconductor die 200 (like monolithic semiconductor die 100 (FIG. 1)) may include high-side driver circuit 11, controller circuit 12, and low-side driver circuit 13 fabricated in pockets (e.g., pockets P1, P2 and P3, respectively) in semiconductor material layer 20. Pockets P1, P2 and P3 are isolated from each other in the horizontal x direction by vertical deep trenches 15 that are filled with insulator 15-1. A p– doped semiconductor layer (e.g., p– doped layer 17) is disposed on bottom surface SB of semiconductor material layer 20 (which includes drain regions 18 of MOSFETs 30). A passivating layer 19 (e.g., an oxide layer) may be disposed on p– doped layer 17. Backside drain contact to drain regions 18 of the MOSFET devices in monolithic semiconductor die 200 is made by drain conductor 34 through openings 34O in p– doped layer 17 and passivating layer 19. Further, the backside drain connections are fully isolated from the substrate (e.g., by passivating layer 19).

In the foregoing scheme for backside drain contact in monolithic semiconductor die 200, pockets P1 and P2, and pockets P2 and P3, are electrically connected to each other by p– doped layer 17 disposed on the backside Thus, monolithic semiconductor die 200 includes MOSFETS 30 of the high-side driver circuit 11 and the low-side driver circuit 13 configured in a backside drain contact topology. Further, in some example implementations, an opening 25 may be made through p– doped layer 17 and passivating layer 19 to enable a potential backside access or contact to controller circuit 12 in pocket P2 from the backside if needed for an application. In some implementations, the potential backside access or contact to pocket P2 from the backside may be used to avoid full galvanic isolation of the pocket and to reduce the effects of electrostatic discharge (ESD) on the circuits (e.g., controller circuit 12) in the pocket (e.g., pocket P2). The backside access or contact to pocket P2 from the backside may provide, for example, a conductive path for ESD discharge and thus improve ESD performance.

In example implementations, monolithic semiconductor die 200 may be fabricated, for example, on a p– doped semiconductor substrate (as will be further discussed below with reference to FIGS. 6A-6I).

Figure 3:
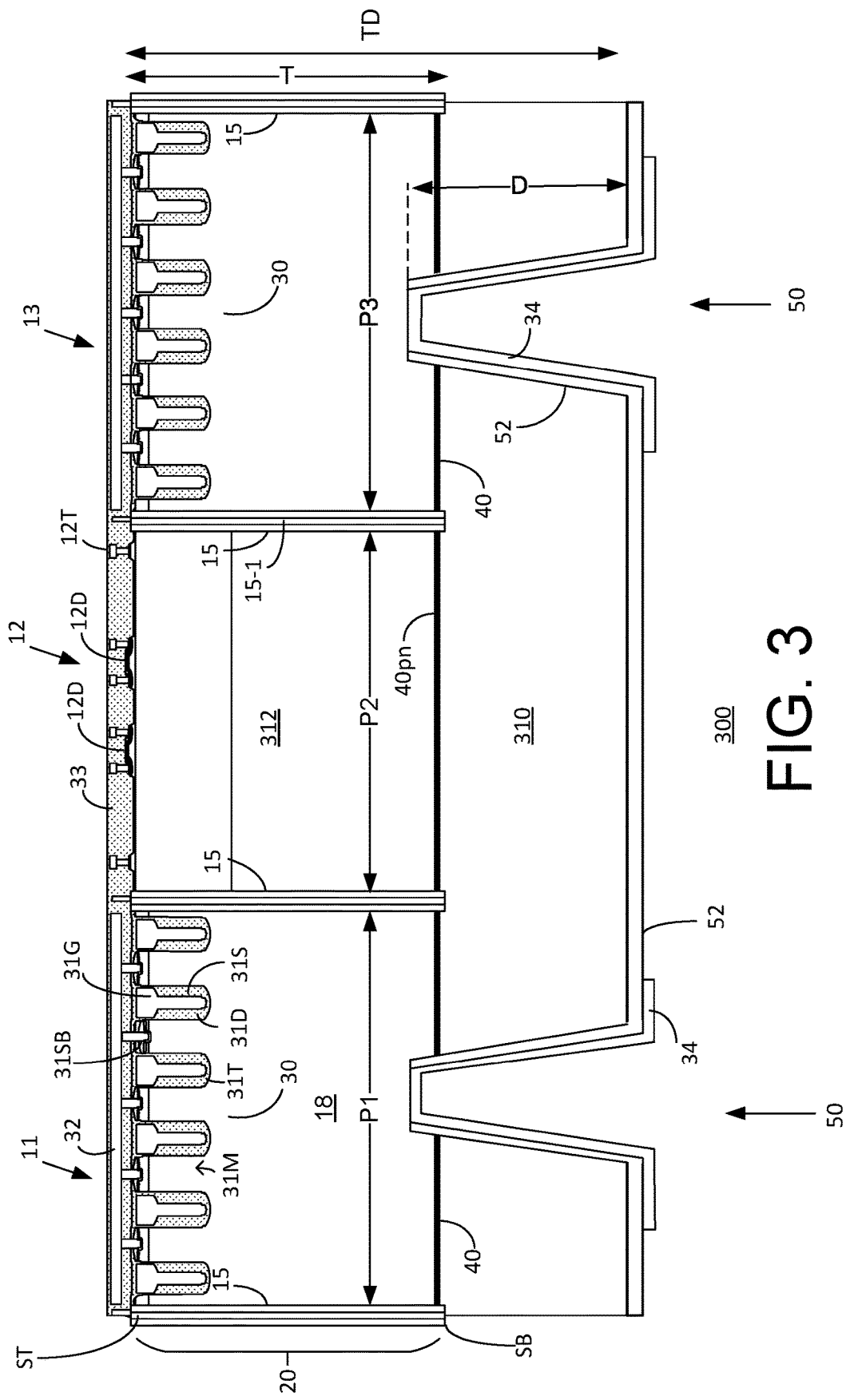
FIG. 3 illustrates a cross-sectional view of yet another example monolithic semiconductor die.

FIG. 3 shows an example monolithic semiconductor die 300 including backside through-silicon vias (TSVs, or BTVSs) used to make contacts to drain regions of MOSFETs in the die. Monolithic semiconductor die 300 may be fabricated, for example, on a semiconductor substrate 310. Semiconductor substrate 310 may be a substrate of a first conductive type (e.g., a p-type silicon substrate). Semiconductor substrate 310 may have a starting thickness in a range of about 300 µm to 950 µm. Semiconductor material layer 20 in which the devices (e.g., MOSFET 30, device 12D, etc.) are fabricated may include an epitaxial layer of the first conductive type (e.g., p-type epitaxial layer 312) deposited on or grown on semiconductor substrate 310.

The BTSVs used to make contacts to drain regions of MOSFETs in the die may be partial or blind backside TSVs that are not etched entirely through a thickness of the die (in other words, the BTSV may extend only partially through the silicon substrate from the backside of the die and not pass through to the top of the die). The partial or blind BTSVs may be made using, for example, lithographic patterning and reactive ion etching (RIE). No etch stop may be involved in the etching, and a depth of the BTSV may be controlled, for example, by etch time, or by etching in conjunction with real time depth measurement techniques (e.g., infrared spectroscopy).

Monolithic semiconductor die 300 (like monolithic semiconductor die 100 (FIG. 1)) may include high-side driver circuit 11, controller circuit 12, and low-side driver circuit 13 (including devices such as MOSFET 30, device 12D, etc.) fabricated in pockets (e.g., pockets P1, P2, and P3, respectively) in semiconductor material layer 20 (of thickness T). In monolithic semiconductor die 300, as described below, isolation of high-side driver circuit 11, controller circuit 12, and low-side driver circuit 13 can be achieved, for example, by a combination of isolated backside TSVs, top side DTI and p-n junction effects.

Further, in monolithic semiconductor die 300, semiconductor material layer 20 may, for example, include a buried conductive layer of a second conductive type (e.g., n-type) formed in epitaxial layer 312 of the first conductive type grown on semiconductor substrate 310. The buried conductive layer may, for example, be N+ layer (e.g., layer 40) formed in p-type epitaxial layer 312 grown on semiconductor substrate 310. The buried N+ layer (e.g., layer 40) may be at a depth (e.g., in a vertical y direction) equal to about (or less than) the thickness T of semiconductor material layer 20 from a top surface (e.g., top surface ST). A p-n junction (e.g., p-n junction 40pn) may form between the buried N+ layer and the p-type silicon substrate.

The buried N+ layer (e.g., layer 40) may be fabricated using a deep n-type buried layer (NBL) implant. The NBL implant and associated implant activation drive may result in the dopant concentration profiles (e.g., n-type dopant profiles) (not shown) needed for the MOSFET drift region and drain region (e.g., drain region 18) of the MOSFET devices (e.g., MOSFET device 30) fabricated in pockets P1 and P3.

In example implementations, deep N wells (DNW) or deep P wells (DPW) (not shown) may be formed (e.g., by ion implantation) in pockets P1, P2 and P3 to isolate the CMOS devices (e.g., device 12D) formed in the pockets. In some example implementations, the deep N wells (DNW) or deep P wells (DPW) may provide, for example, a base line doping profile for devices in a controller circuit (e.g., controller circuit 12 in pocket P2)

Pockets P1, P2 and P3 may be isolated from each other in the horizontal x direction by deep trenches 15 that may extend vertically downward from top surface ST at least until the buried N+ layer (e.g., layer 40) in semiconductor material layer 20. Further, pockets P1, P2 and P3 may be vertically isolated from semiconductor substrate 310 (e.g., p-type semiconductor substrate) (in the vertical y direction) by p-n junctions (e.g., junction 40pn) that may form between p-doped regions and n-doped regions at about the buried N+ layer (e.g., layer 40).

After back grinding and thinning of semiconductor substrate 310, monolithic semiconductor die 300 may have a thickness TD, for example, of about 50 µm to 100 µm. In example implementations, one or more partial or blind backside through-silicon vias (e.g., BTSV 50) may be etched from the backside of the semiconductor substrate 310 that has been thinned. The partial or blind BTSV 50 may have a depth D in semiconductor substrate 310 and may extend vertically upward (e.g., in the y direction) to reach into the drain regions (e.g., drain regions 18) of the MOSFETs (e.g., MOSFETS 30) fabricated in pockets P1 and P3. In example implementations, BTSV 50 may vertically extend past the buried N+ layer (e.g., layer 40) into in pockets P1 and P3 to contact the drain regions (e.g., drain regions 18).

Conductive material 34 (e.g., a metal or metal alloy) deposited in, or plated on sidewalls of, the BTSV may provide backside electrical contact to the drain regions 18 of MOSFETs 30.

In example implementations, an insulating liner (e.g., insulator 52) (e.g., oxide, nitride or alumina) may be deposited on sidewalls of the BTSV (and on the backside of the substrate) to electrically isolate the BTSV and conductive material 34 from the substrate.

In example implementations, the substrate (e.g., the semiconductor substrate 310 that has been thinned isolated from high-side driver circuit 11 and low-side driver circuit 13 in pockets P1 and P3) can be simply grounded as usual for BCD technologies.

Thus, monolithic semiconductor die 300 may include MOSFETS 30 of high-side driver circuit 11 and low-side driver circuit 13 configured in a backside drain contact topology.

The BTSV in monolithic semiconductor die 300 may act as an efficient heat sink by minimizing electrical and thermal resistance paths, and thus improve both DC and switching thermal performance (including, e.g., unclamped inductive switching (UIS) and self-clamped inductive switching (SCIS) performance).

In example implementations, incorporating the BTSV in the monolithic semiconductor die 300 can reduce a need to have a small semiconductor thickness (TD) for maintaining a ruggedness of the wafer.

In example implementations, monolithic semiconductor die 300 may include fully isolated NMOS and/or PMOS devices (e.g., in controller 12) enabling single or multiple half bridge or full bridge power circuit configurations.

Monolithic semiconductor dies 100, 200 and 300 (discussed above with reference to FIGS. 1-3) have the MOSFET devices (e.g., MOSFET device 30) in the isolated pockets P1 and P3 configured in a backside drain contact topology (i.e., with contact to the drain regions (e.g., drain region 18) of the MOSFETs being made from a backside of the die). High side driver circuit and low side driver circuits MOSFETs 30 fabricated, for example, in pockets P1 and P3 may have identical or matching structures and performance characteristics.

In some implementations, a monolithic semiconductor die may include power circuits and devices with contact topologies of mixed orientations (i.e., a top side drain contact topology and a backside drain contact topology) across different isolated pockets in the die. For example, a MOSFET device in a first pocket may have a backside drain contact topology, and a MOSFET device in a second pocket may have a top side drain contact topology.

Figure 4A:
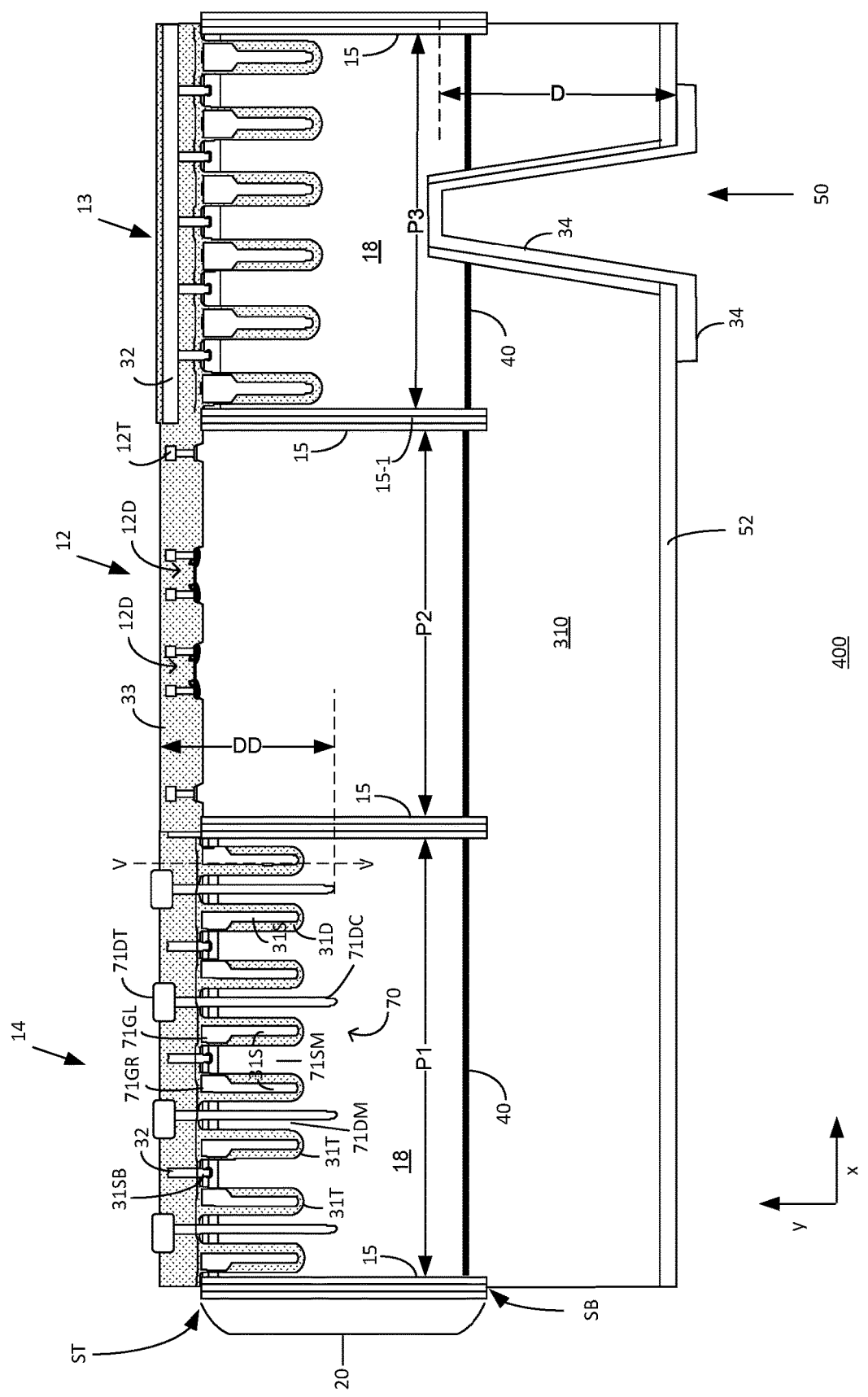
FIG. 4A illustrates an example monolithic semiconductor die including MOSFETs with different drain contact orientations or topologies in the die.

FIG. 4A shows an example monolithic semiconductor die 400 including MOSFETs with different drain contact orientations or topologies in the die. Monolithic semiconductor die 400, like monolithic semiconductor die 300, may have isolated pockets (e.g., pockets P1, P2, and P3) fabricated in a semiconductor material layer 20 (of thickness T), for example, on a semiconductor substrate 310 (e.g., p-type semiconductor substrate).

Monolithic semiconductor die 400 (like monolithic semiconductor die 300 (FIG. 3)) may include controller circuit 12, and low-side driver circuit 13 (including devices such as MOSFET 30, device 12D, etc.) fabricated in isolated pockets P2 and P3, respectively. MOSFET 30 in low-side driver circuit 13 may have a backside drain contact topology with contact to the drain region (e.g., drain region 18) of the MOSFET being made from a backside of the die. The backside drain contact may be made using a partial or blind BTSV (e.g., BTSV 50) (as discussed above with reference to FIG. 3).

Monolithic semiconductor die 400 may further include a high-side driver circuit 14 (including a MOSFET 70) fabricated in pocket P1. MOSFET 70 may include drain contact terminals (e.g., drain contact terminals 71DT) for connection to drain region 18 of the device. The drain contact terminals 71DT may be disposed on a top side (e.g., at or above top surface ST) of the die (in other words MOSFET 70 may have a top side drain contact topology).

In example implementations, MOSFET 70 as shown, for example, in FIG. 4A, may be a vertical trench shielded gate MOSFET device with device elements formed in a plurality of vertical trenches (e.g., trenches 31T) and mesas (e.g., mesas 71SM and mesas 71DM) in pocket P1 of semiconductor material layer 20. The mesas may include a number of source mesas (e.g., source mesas 71SM) that include the source and body regions (e.g., regions 31SB) of the device, and a number of drain mesas (e.g., drain mesas 71DM) that include vertical conductors (e.g., drain conductors 71DC) for contacting the drain region of the device.

As in MOSFET 30, the source and body regions (e.g., regions 31SB) of the device that may be contacted on the top side of the die by source conductor 32.

In example implementations, drain contact terminals (e.g., drain contact terminals 71DT) for electrical connection to the drain regions (e.g., drain region 18) of the device may also be disposed on a top side (at or about top surface ST). Drain conductors (e.g., drain conductors 71DC) may extend from the drain contact terminals 71DT through at least some of the drain mesas 71DM formed between some adjoining pairs of trenches 31T. The drain conductors 71DC may extend to a distance (DD) vertically below or underneath trenches 31T (in the y direction) to electrically connect to drain region 18 of the device to the drain contact terminals 71DT. In example implementations, drain conductors 71DC may be made of metal (e.g., tungsten, aluminum, or a metal alloy). In some example implementations, a drain conductor 71DC may be formed by a trench filled with conductive material (e.g., doped polysilicon or doped glass). In some example implementations, a drain conductor 71DC may be made as a trench filled with conductive material (e.g., doped polysilicon or doped glass). In some example implementations, drain conductor 71DC may be formed by conductive material (e.g., doped silicon) incorporated in a drain mesa (e.g., drain mesa 71DM). The conductive material (e.g., doped silicon) may be incorporated in the drain mesa, for example, by ion implantation. In some example implementations, MOSFET 70 may have a top side drain contact topology with drain contacts made by shallow contacts (i.e., without trenches) on the top side.

In example implementations, a number of drain mesas 71DM in the device used for making the drain contacts may be the same as, less than, or more than, the number of source mesas 71SM that include the source and body regions (e.g., regions 31SB) of the device needed to provide the transistor functions of the device. In an example implementation, the number of drain mesas 71DM may be the same as the number of source mesas 71SM (e.g., with the two types of mesas alternating in position in the horizontal x direction).

FIG. 4A shows example monolithic semiconductor die 400 including MOSFET 70 (with a top side drain contact topology) in which the number of drain mesas 71DM is about the same as the number of source mesas 71SM with the two types of mesas alternating in position in the horizontal x direction). In the example shown in FIG. 4A, there is one drain mesa 71DM for about every one source mesa 71SM.

Figure 4B:
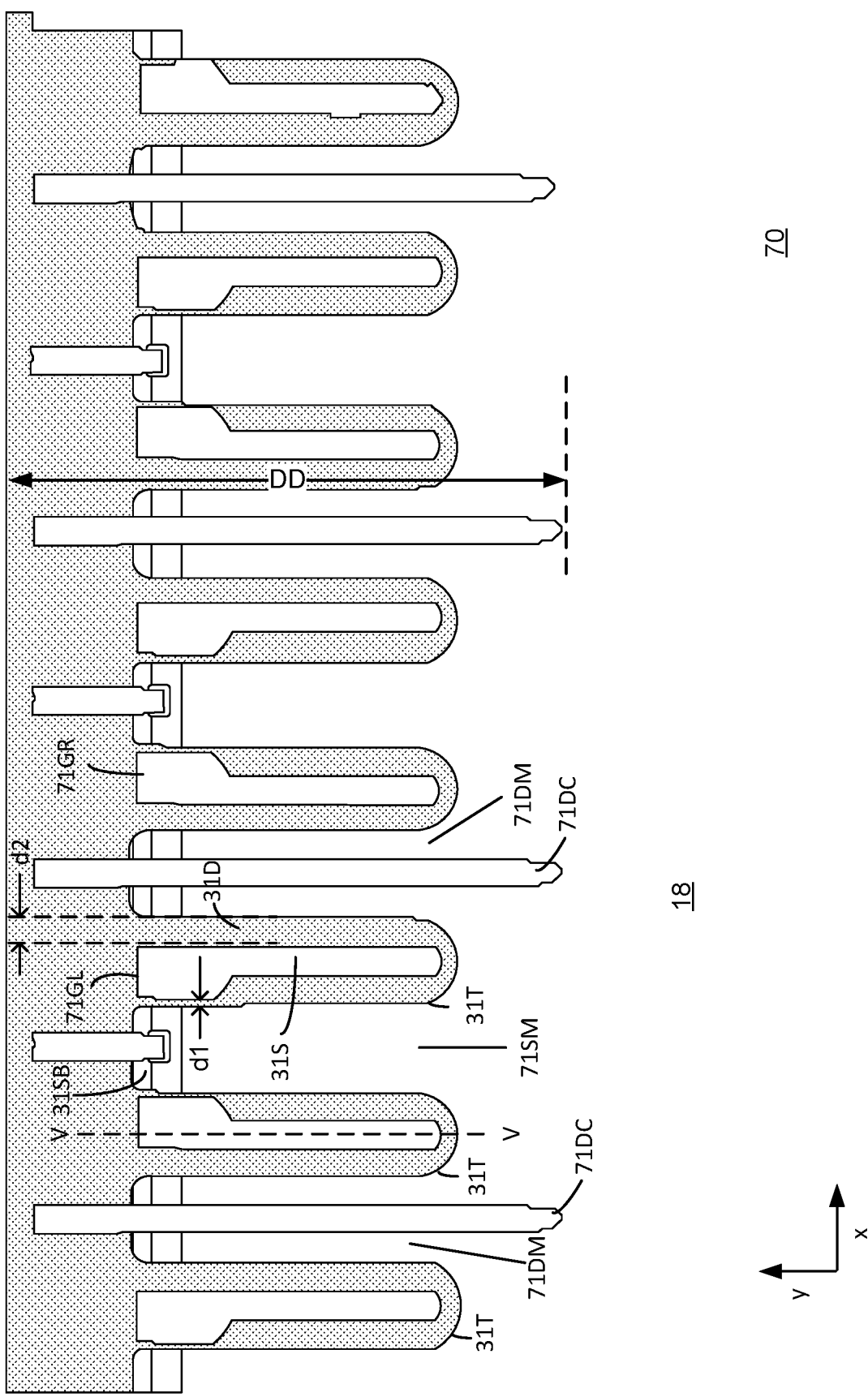
FIG. 4B is an exploded view of a portion of FIG. 4A.
Figure 4C:
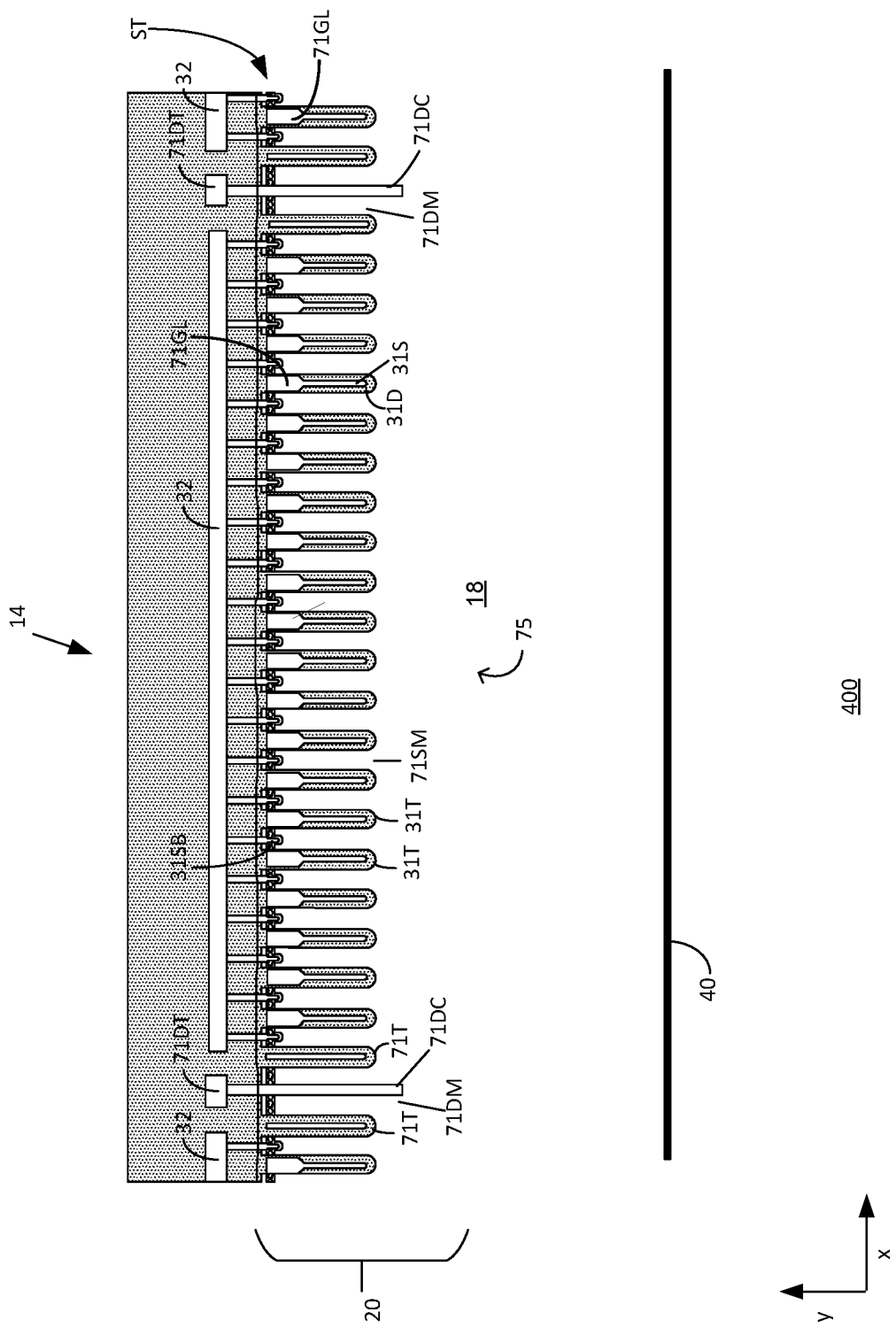
FIG. 4C illustrates a monolithic semiconductor die with another example MOSFET with a top side drain contact topology.
Figure 4D:
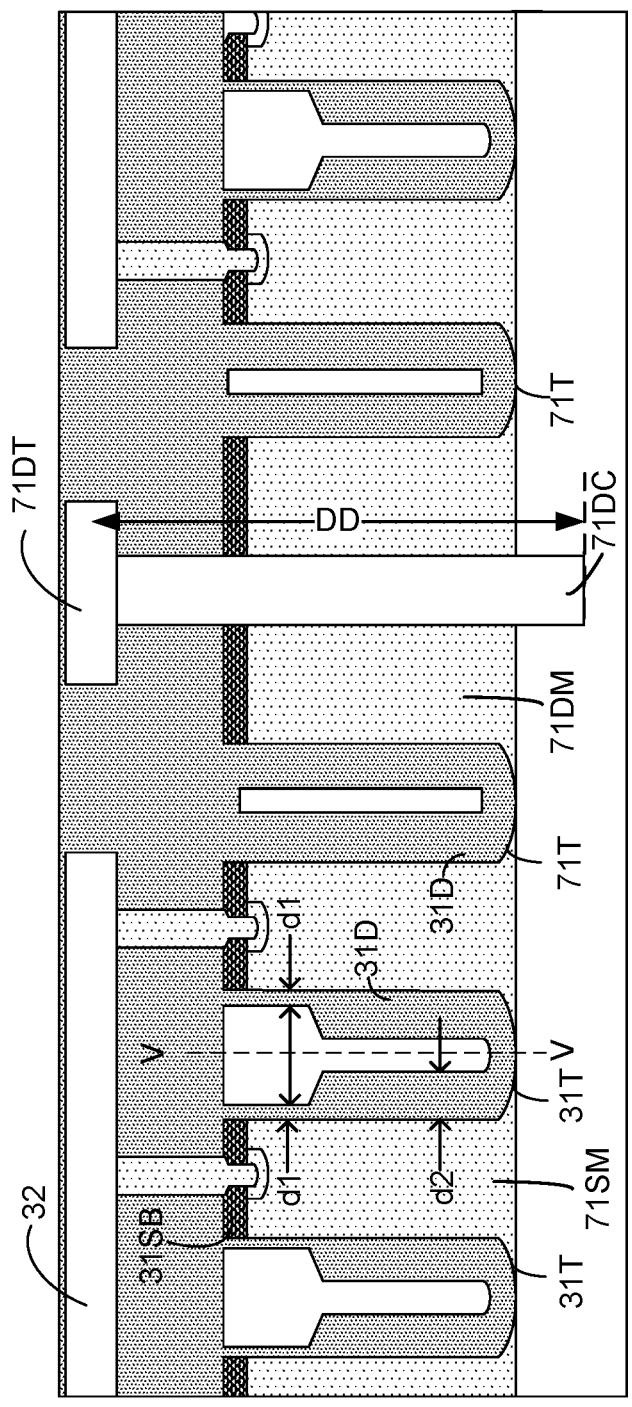
FIG. 4D is an exploded view of a portion of FIG. 4C.

FIG. 4C and FIG. 4D (discussed later below) show monolithic semiconductor die 400 with another example MOSFET 75 with a top side drain contact topology. For visual clarity, FIG. 4C shows only a portion of the MOSFET (e.g., MOSFET 75) fabricated for high-side driver circuit 14 in layer 20 (pocket P1) of monolithic semiconductor die 400. Other portions of monolithic semiconductor die 400 (e.g., pockets P2 and P3) shown, for example, in FIG. 4A, are not repeated in FIG. 4C.

In MOSFET 75, the number of drain mesas 71DM and the number of source mesas 71SM are unequal. As shown in FIG. 4C, there is, for example, only one drain mesa 71DM for about every twenty-two source mesas 71SM (on one side of drain mesa 71DM). In MOSFET 75, each drain mesa 71DM is defined by (i.e., disposed between) two drain trenches 71T. A drain conductor 71DC may extend to a distance (DD) (in the y direction) through a drain mesa 71DM to electrically connect drain region 18 of the device underneath the trenches to a drain contact terminal 71DT on a top side of the MOSFET 75.

With renewed reference to FIG. 4A, in monolithic semiconductor die 400, gate poly 71GL and 71GR, and shield poly 31S of MOSFET 70 are disposed in pairs of trenches 31T adjoining source mesas 71SM that include source and body regions (e.g., regions 31SB) of MOSFET 70. FIG. 4B shows an exploded view of MOSFET 70.

In MOSFET 70, as in MOSFET 30, gate poly and shield poly structures disposed in the inter-mesa trenches (e.g., trenches 31T) may form the gate electrode and the shield electrode of the device. The gate poly and the shield poly may be disposed in trenches that have sidewalls coated or covered by a layer of insulating dielectric (e.g., dielectric 31D). The insulating dielectric 31D disposed on sidewalls of trenches isolates the mesas from the gate electrode and the shield electrode of the device.

In some example implementations of MOSFET 70, the combined shield poly and gate poly disposed in a trench 31T next to a source mesa 71SM may have an asymmetric shape (e.g., a mailbox flag-like shape) about a vertical midline (e.g., midline V-V) of the trench. For example, as shown in FIG. 4B, gate poly 71GL may be disposed asymmetrically about midline V-V of a trench 31T so that the gate poly is at a smaller separation distance d1 from the source mesa 71SM to the left of the trench and a larger separation distance d2 (d2>d1) from a drain mesa 71DM to the right of the trench. The smaller separation distance d1 may correspond to the thickness of a gate oxide of the device channel (not shown) associated with mesa 71SM. The larger separation distance d2 may correspond to a thicker layer of insulating dielectric (e.g., dielectric 31D) between the gate electrode and the drain mesa 71DM. The thicker layer of the insulating dielectric can result in a higher or better isolation of the drain mesa than with a thinner layer of the insulating dielectric corresponding to the smaller separation distance d1.

Thus, monolithic semiconductor die 400 may include a high-side driver circuit 14 (including a MOSFET 70) in a top side drain contact topology and a low-side driver circuit 13 (including MOSFET 30) in a backside drain contact topology.

In some other example implementations, a MOSFET with a top side drain contact topology (e.g., MOSFET 75, FIG. 4C) fabricated in monolithic semiconductor die 400 may have combined shield poly (e.g., shield poly 31S) and gate poly (e.g., gate poly 71G) disposed in a symmetric shape in a trench 31T next to a source mesa 71SM. FIG. 4D shows an exploded view of a portion of MOSFET 75 shown in FIG. 4C.

As shown in FIGS. 4C and 4D, combined shield poly 31S and gate poly gate poly 71G may, in a cross sectional view (in a x-y plane), have a symmetric shape (e.g., a symmetric paddle or oar-like shape) about a vertical midline (e.g., midline V-V) of trench 31T. In the cross sectional view, gate poly 71G may form a generally rectangular flat blade portion of the paddle or oar-like shape. Shield poly 31S may form the handle or shaft attached to the rectangular flat blade portion formed by gate poly 71G.

Gate poly 71G may be separated by a layer of dielectric 31D (e.g., an oxide) of thickness d1 from the source mesas 71SM next to the trench. Shield poly 31 may be separated by a thicker layer of dielectric 31D (e.g., an oxide) of thickness d2 (with (d2>d1) from the source mesas 71SM next to the trench. The smaller separation distance d1 may correspond to the thickness of a gate oxide of the device channel (not shown) associated with mesa 71SM. The larger separation distance d2 may correspond to a thicker layer of insulating dielectric (e.g., dielectric 31D) between shield poly 31 (below that gate electrode) and the source mesa 71SM.

In MOSFET 75, the two drain trenches 71T on either side of a drain mesa 71DM may filled or lined with a thick insulating dielectric (e.g., (e.g., dielectric 31D). The two drain trenches 71T on either side of a drain mesa 71DM may be electrically inactive (i.e., not participate in controlling or affecting source-to-drain current flow through the device).

Thus, monolithic semiconductor die 400 may include a high-side driver circuit 14 (including a MOSFET 75) (or a low-side driver circuit 13) in a top side drain contact topology.

The flexibility of including power circuits and devices with different drain contact topologies in different isolated pockets of a monolithic semiconductor die (as illustrated, for example, in FIG. 4A and FIG. 4C) may provide opportunities for customizing or configuring monolithic semiconductor die for different power circuit applications and requirements (e.g., to withstand avalanche currents when subjected to unclamped inductive switching, for different Rsp requirements, etc.).

Semiconductor fabrication can involve many sequential process steps (e.g., wafer processing step) that add, subtract, modify, or pattern materials on a semiconductor substrate or wafer. The term semiconductor substrate (or wafer) as used herein refers not only to the semiconductor substrate (or wafer) at the start of the semiconductor fabrication processes, but also refers to the result or output of each of the process steps that, for example, add, subtract, modify, or pattern materials on an input substrate (or wafer).

FIGS. 5A through 5H illustrate a method for incorporating or fabricating multiple isolated power circuits and devices in a monolithic semiconductor die (e.g., monolithic semiconductor die 100).

Figure 5A:
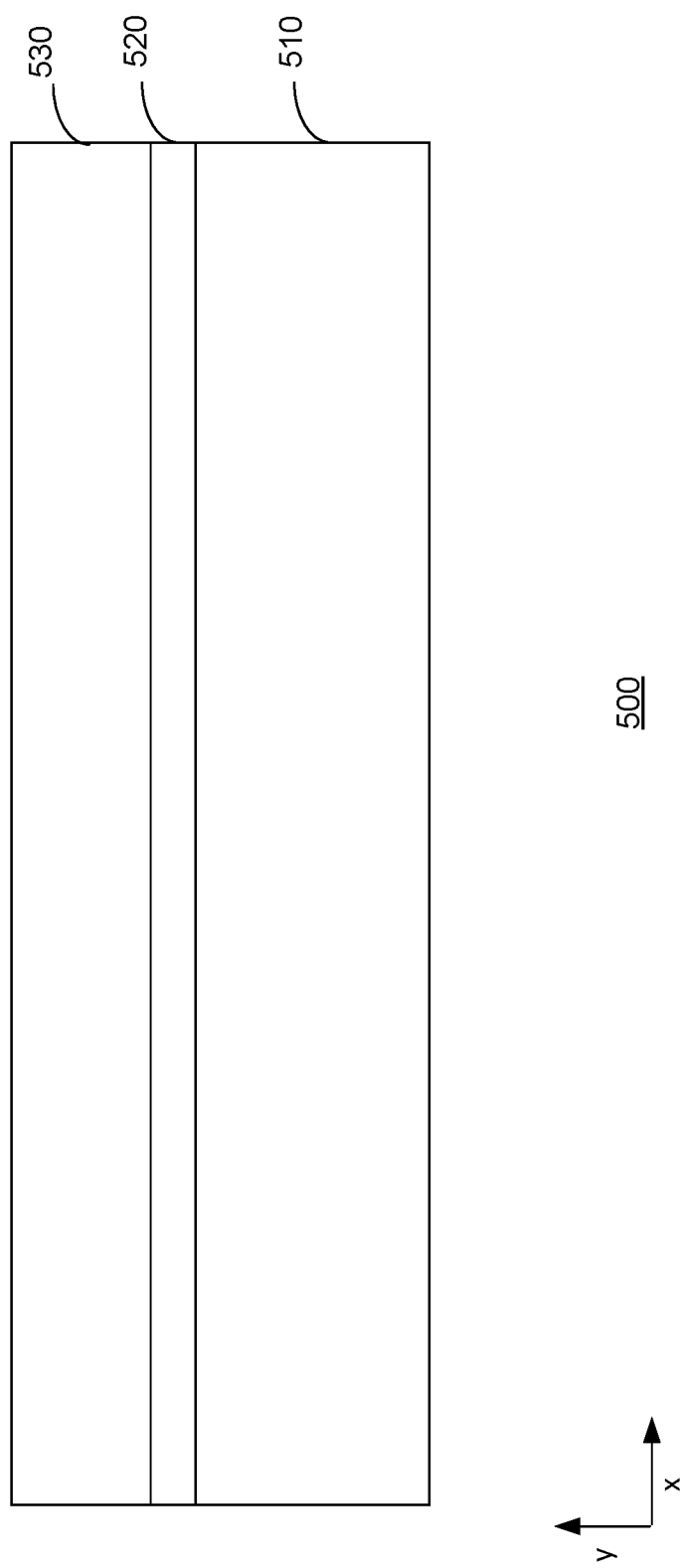
FIGS. 5A through 5H illustrate an example method for incorporating or fabricating multiple isolated power circuits and devices in a monolithic semiconductor die.

In example implementations, the monolithic semiconductor die may be fabricated in a silicon-on-insulator (SOI) wafer (e.g., a bonded SOI wafer). FIG. 5A is a cross-sectional view of an example SOI wafer 500 that can be used for the process. SOI wafer 500 may include a layer of silicon (e.g., overlayer 530) disposed on a buried oxide (BOX) layer (e.g., oxide layer 520). The BOX layer itself may be disposed on a handle silicon wafer or substrate (e.g., a silicon substrate 510 (e.g., p-type silicon substrate)).

In example implementations, overlayer 530 (which may be a n-type silicon layer) may have a resistivity in a range of about 1.0 to 3 mOhm-cm, and a thickness in a range from about 1 μm to greater than 200 μm (e.g., 30 to 50 μm, 40 μm). Oxide layer 520 may, for example, be a thermal oxide, and have a thickness in a range from 0.3 μm to 4 μm (e.g., 1 μm). The silicon substrate 510 (e.g., p-type silicon substrate) may have a starting thickness in a range of about 300 μm to 950 μm.

Figure 5B:
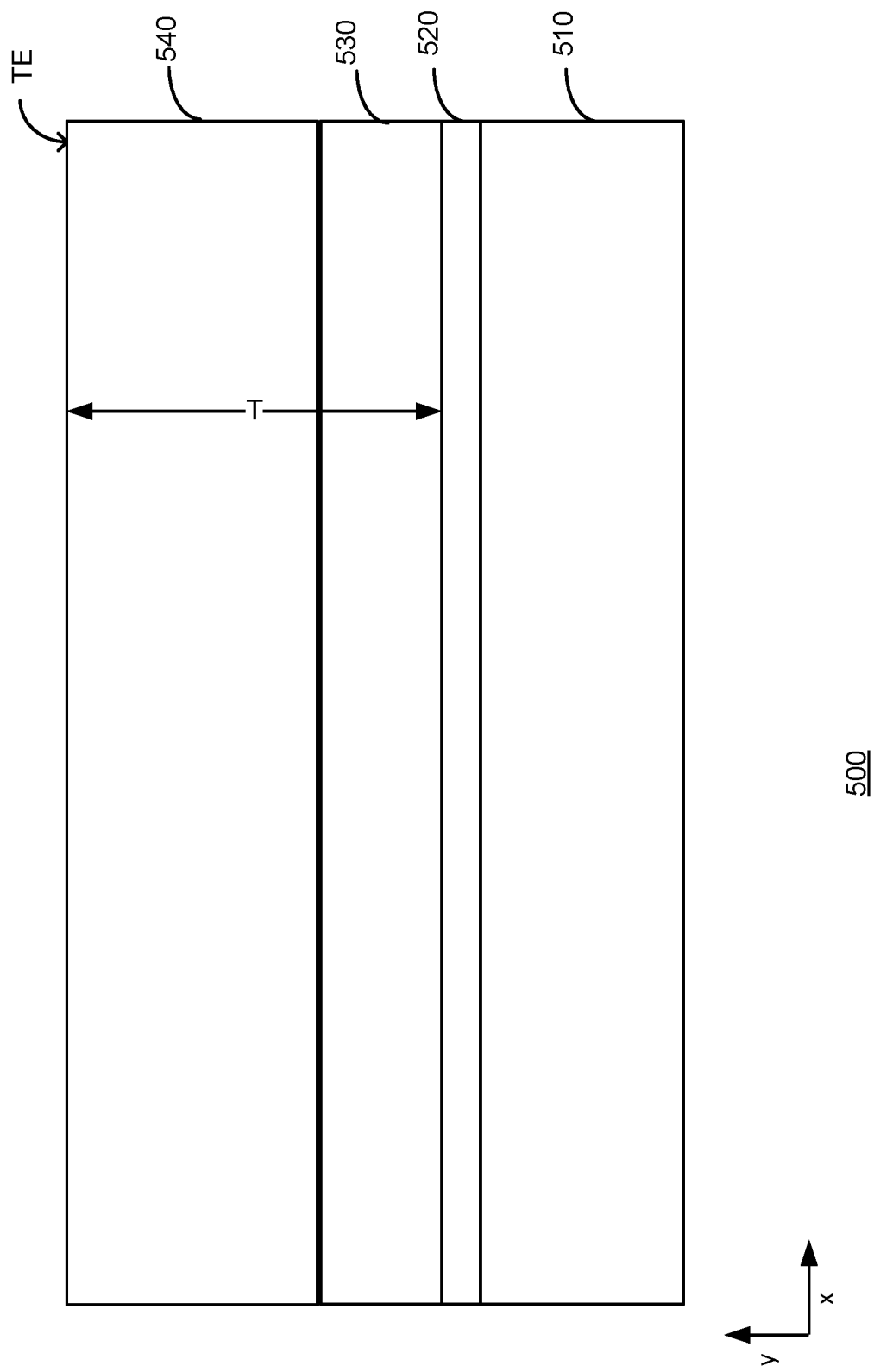

Next as shown in FIG. 5B, an epitaxial layer of silicon (e.g., epi layer 540) may be grown on top of overlayer 530. Epi layer 540 may have a top surface TE. The combined silicon material of overlayer 530 and epi layer 540 lying above oxide layer 520 can be referred to as silicon layer 20 (as previously labelled in FIGS. 1-4) in which power circuits and devices may be fabricated. In example implementations, silicon layer 20 may have thickness T of about 30 to 50 μm (e.g., 40 μm).

At next steps in the process, deep trenches (e.g., deep trenches 15) may be etched from the top surface TE through epi layer 540 and overlayer 530 to reach the BOX layer (i.e., oxide layer 520). Deep trenches 15 may be formed by dry etch processes that use the oxide layer as an etch stop. The deep trenches 15 may be filled with insulating material (e.g., oxide 15-1).

Figure 5C:
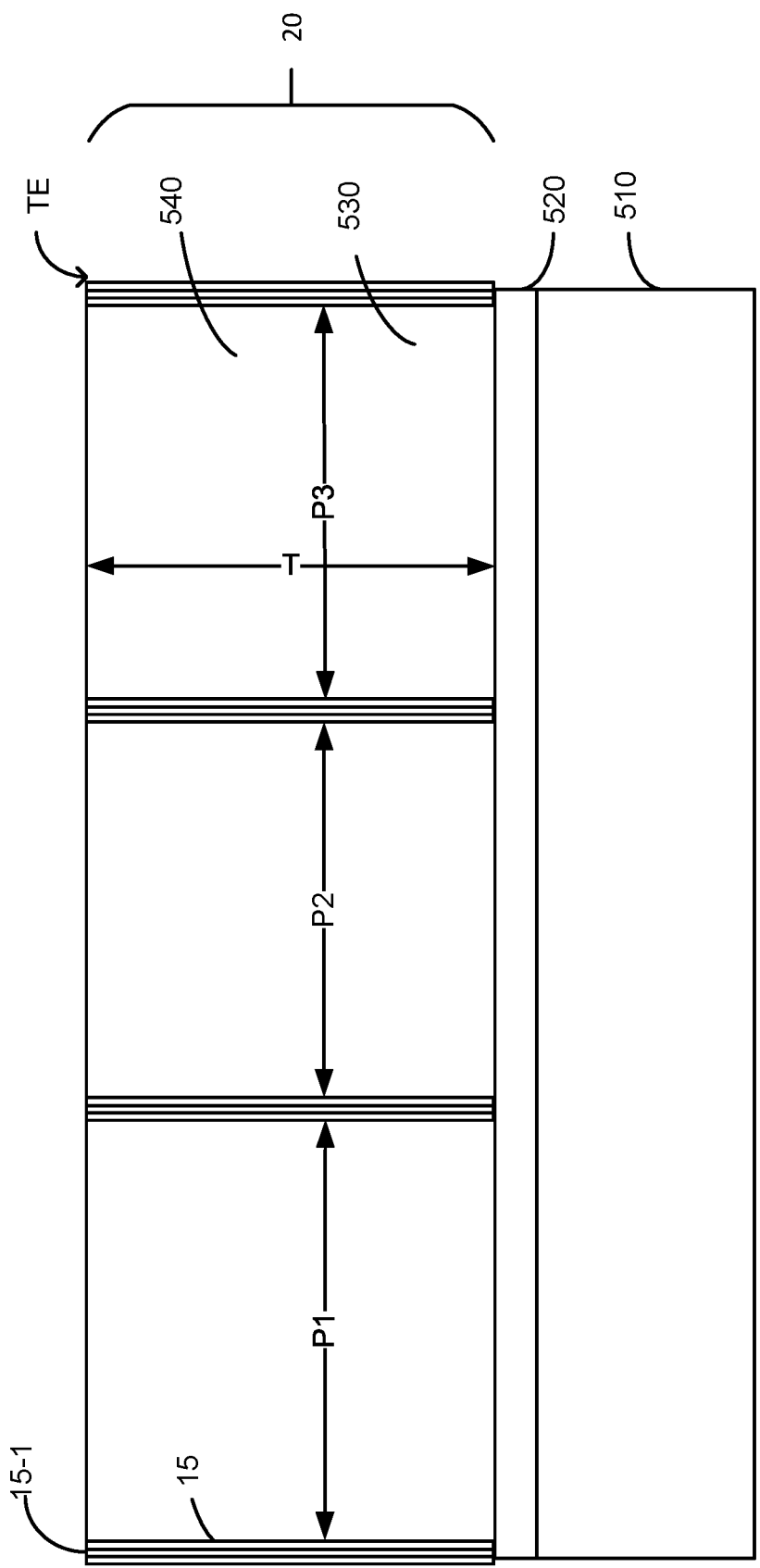

As shown in FIG. 5C, a number n (e.g., n=4) of insulator-filed deep trenches may be fabricated to divide or partition the silicon material of overlayer 530 and epi layer 540 lying above oxide layer 520 into a number (e.g., three) isolated pockets (e.g., P1, P2 and P3) of silicon material. Pockets P1, P2 and P3 may be isolated from each other in the horizontal x direction by the deep trenches 15, and from below (e.g., in the vertical y direction) by the BOX layer (i.e., oxide layer 520).

At next steps in the process, power circuits and devices may be fabricated in the isolated pockets P1, P2 and P3. For example, as discussed with reference to FIG. 1 high-side driver circuit 11, controller circuit 12, and low-side driver circuit 13 may be fabricated in the isolated pockets (e.g., pockets P1, P2 and P3, respectively). The high-side driver circuit 11 and low-side driver circuit 13 fabricated in pockets P1 and P3 may include MOSFET devices (e.g., MOSFET 30, FIG. 1). Industrial integrated circuit and device fabrication processes and techniques (including, for example, lithographic patterning, dopant implantation and diffusion, etching and deposition of materials, etc.) may be utilized for fabricating the circuits in pockets P1, P2 and P3.

Figure 5D:
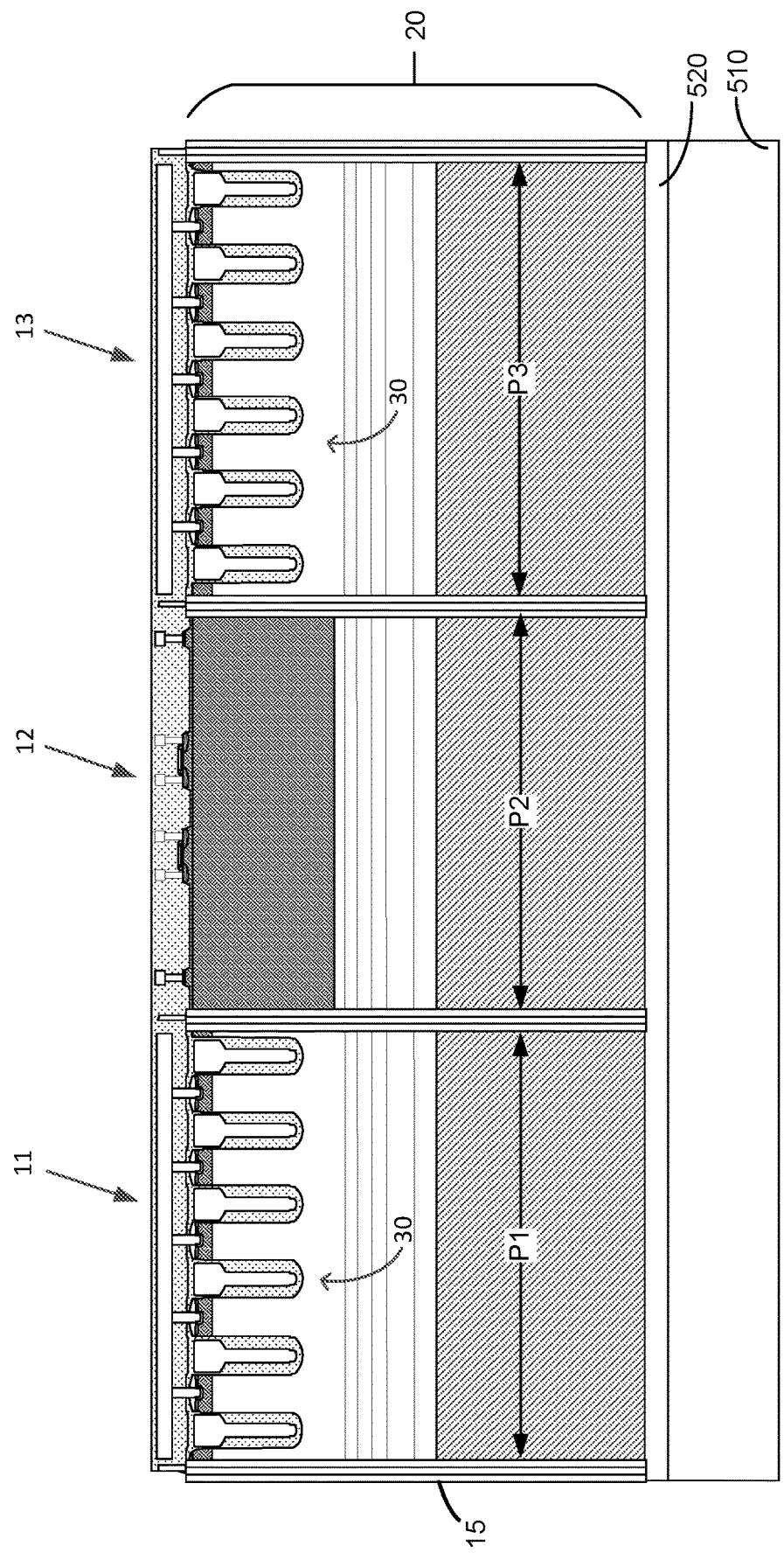

FIG. 5D shows a cross-sectional view of SOI wafer 500 after high-side driver circuit 11, controller circuit 12, and low-side driver circuit 13 have been fabricated in the silicon material in layer 20 in pockets P1, P2 and P3, respectively, above the BOX layer (i.e., oxide layer 520) and the handle silicon wafer or substrate (i.e., silicon substrate 510).

Figure 5E:
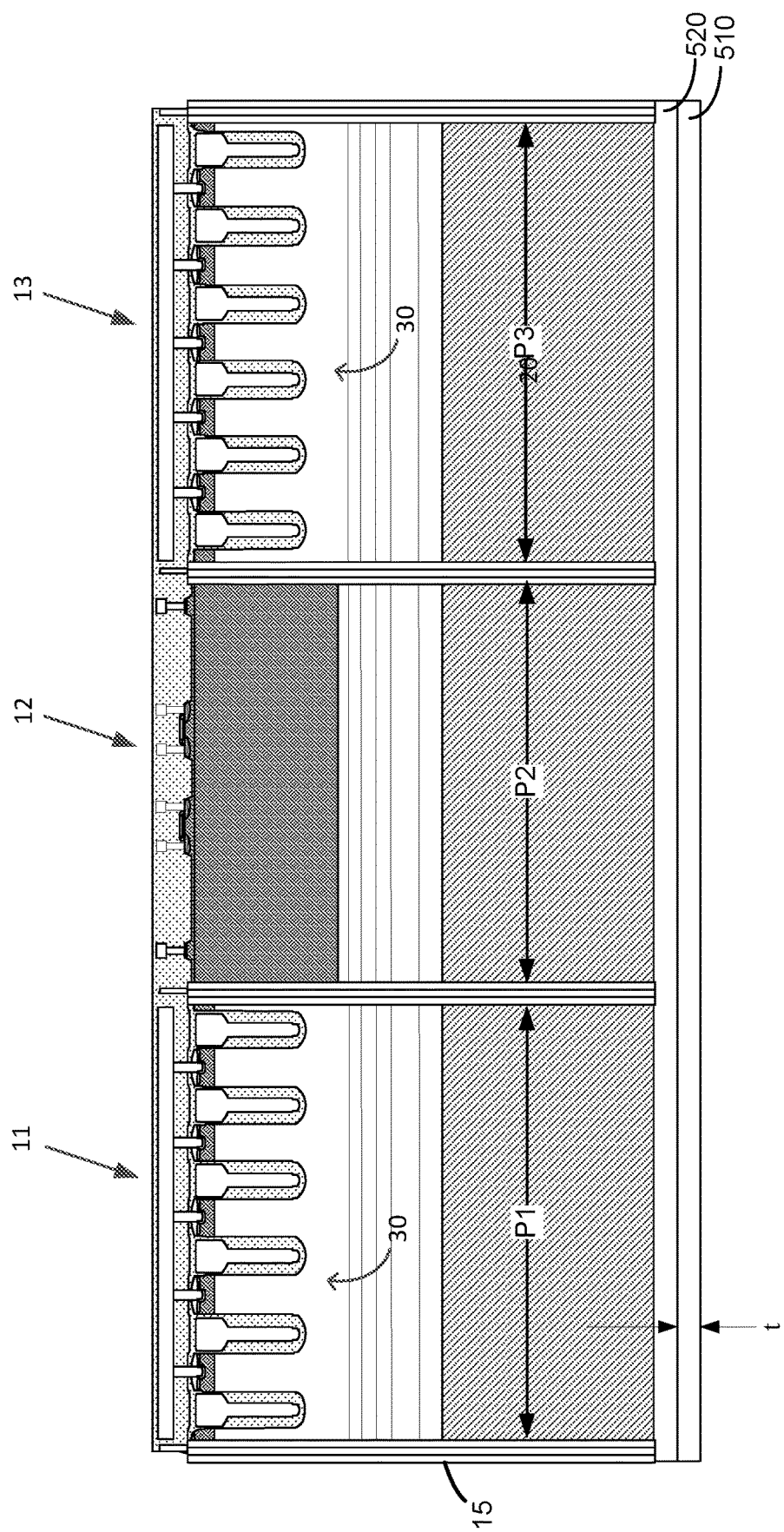
Figure 5F:
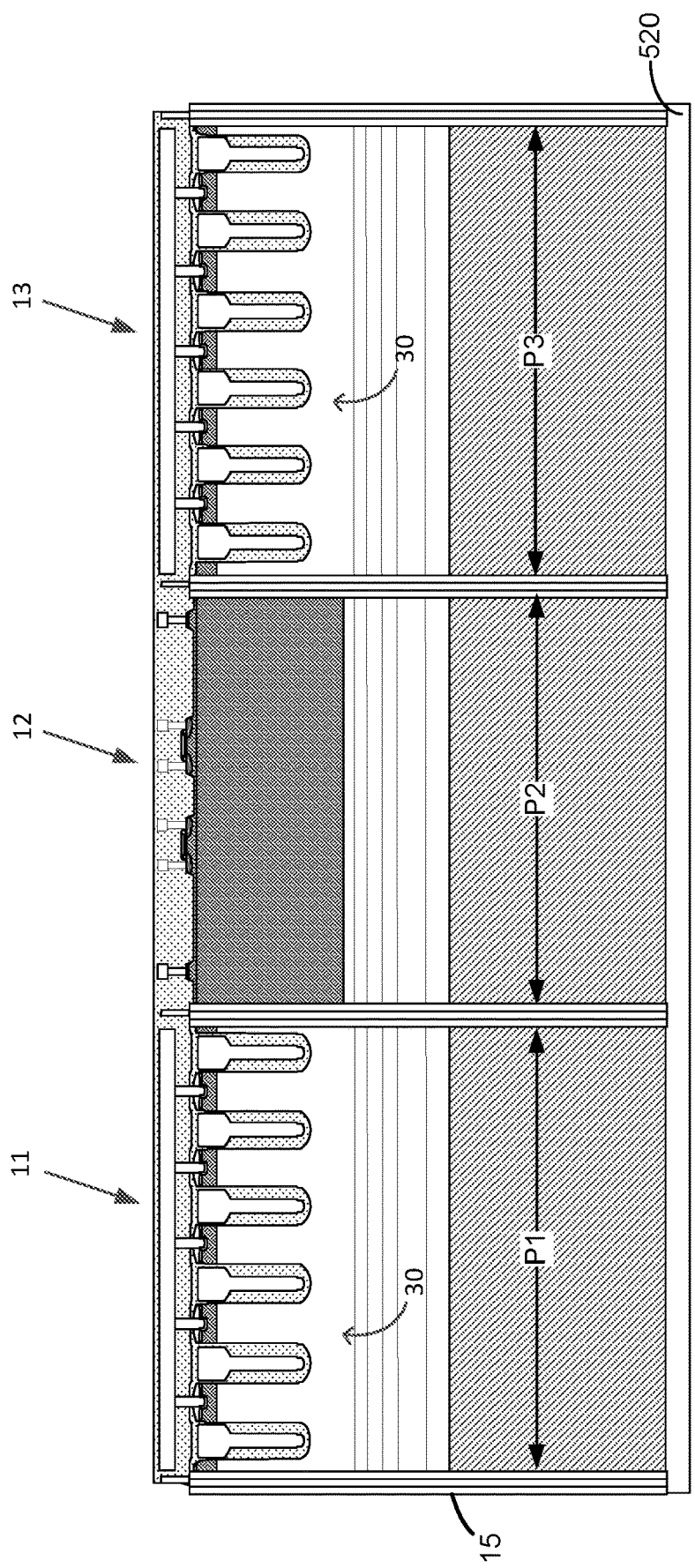

In further steps in the process, back grinding, and polishing or etching techniques may be used to thin the handle silicon wafer or substrate (i.e., silicon substrate 510) to a thickness t as shown, for example, in FIG. 5E. In example implementations, thickness t may be about 5 μm or less. Next, as shown in FIG. 5F, the silicon substrate 510 that has been thinned may be completely removed by etching or polishing (using, e.g., oxide layer 520 as an etch stop). Only oxide layer 520 may remain on the backside of SOI wafer 500.

Figure 5G:
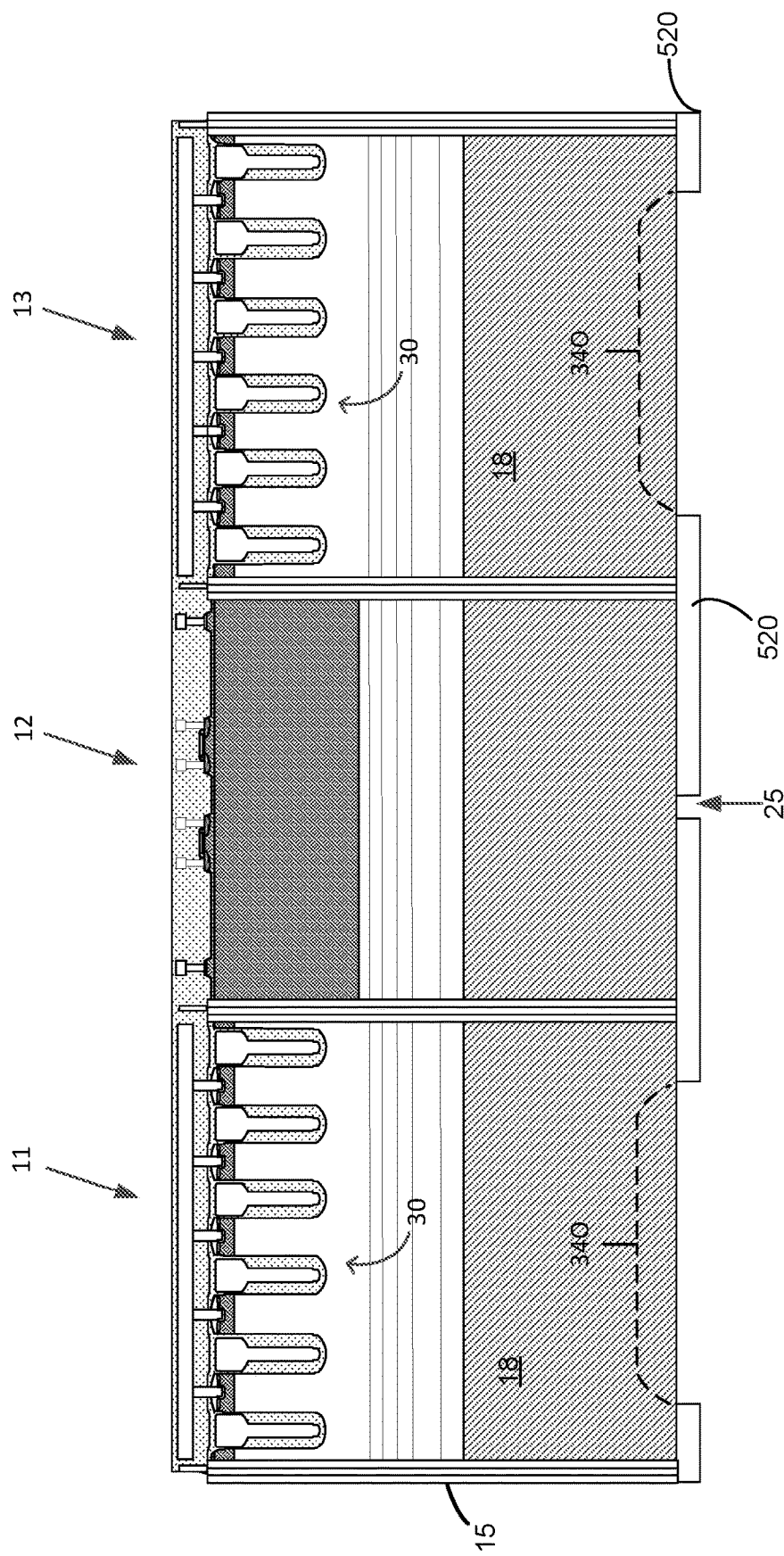
Figure 5H:
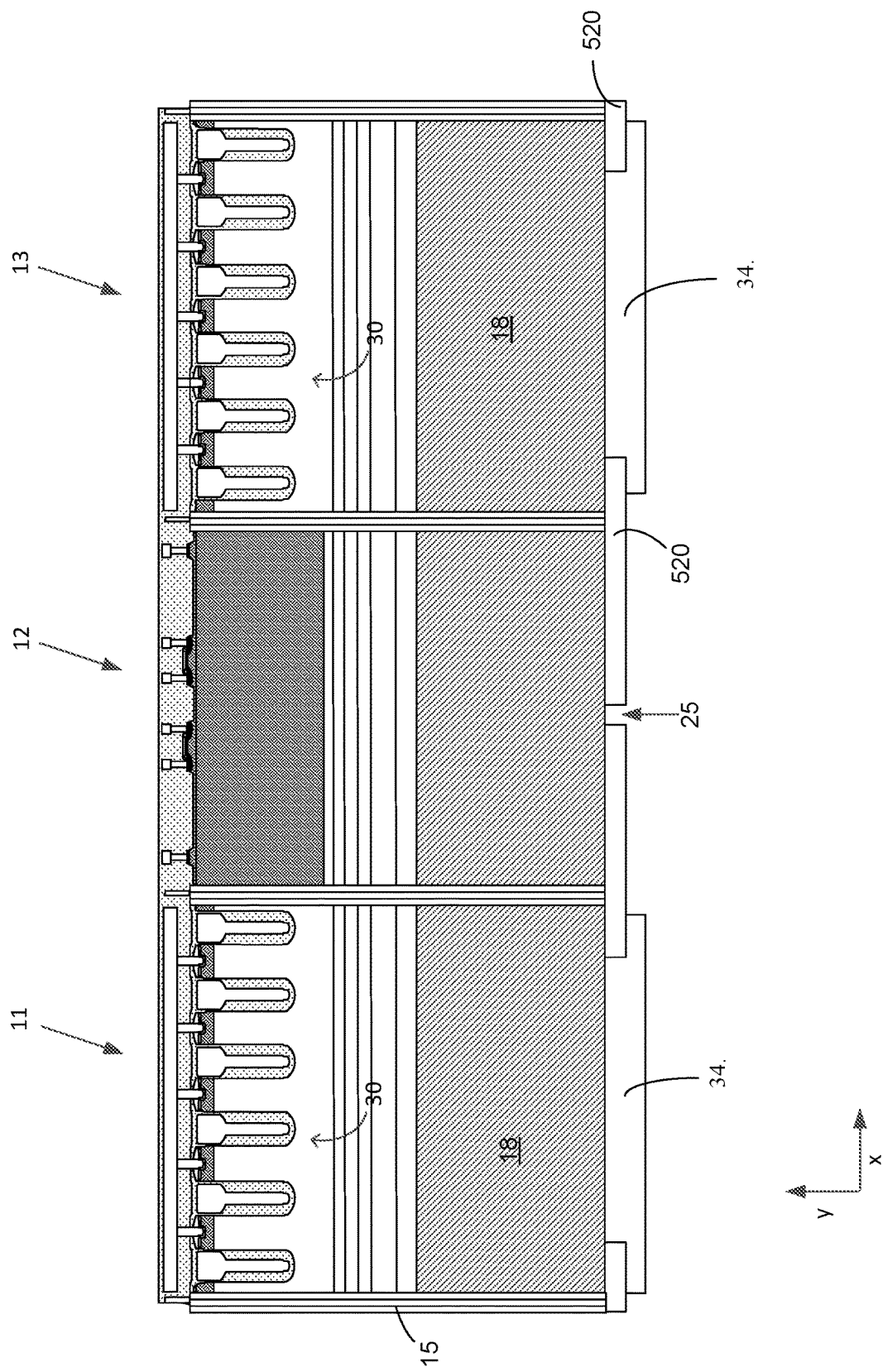

Further, as shown in FIG. 5G, for backside connections to the drain regions (e.g., drain region 18) of MOSFETs 30 in pockets P1 and P3, openings 34O can be made in oxide layer 520 that remains on the backside of SOI wafer 500. In some implementations, an opening 25 may also be made in oxide layer 520 for potential connection to the backside of circuit 12 in pocket P2, Openings 34O may be made using, for example, lithographic patterning and etching techniques. Next, the backside of SOI wafer 500 may be metalized to make electrical connection to the drain regions of MOSFETS 30 through openings 34O. For example, as shown in FIG. 5H, conductive material (e.g., conductor 34. a metal or metal alloy) may be deposited on the backside of SOI wafer 500 to make electrical connection to the drain regions of MOSFETS 30 through openings 34O.

SOI wafer 500 may then be diced or singulated (not shown) to obtain monolithic semiconductor die (e.g., monolithic semiconductor die 100, FIG. 1) including the individual power circuits fabricated in isolated pockets of semiconductor material (e.g., high-side driver circuit 11, controller circuit 12, and low-side driver circuit 13 fabricated in isolated P1, P2 and P3, respectively). As discussed above, MOSFET devices (e.g., MOSFET 30) monolithic semiconductor die that are configured in a backside drain topology can be fabricated using the process illustrated in FIGS. 5A-5H.

FIGS. 6A through 6I illustrate another example method for incorporating or fabricating multiple isolated power circuits and devices in a monolithic semiconductor die (e.g., monolithic semiconductor die 200, FIG. 2).

In example implementations, the monolithic semiconductor die may be fabricated in a bonded or epitaxially-grown silicon wafer having three layers of silicon material with three different dopant concentrations.

Figure 6A:
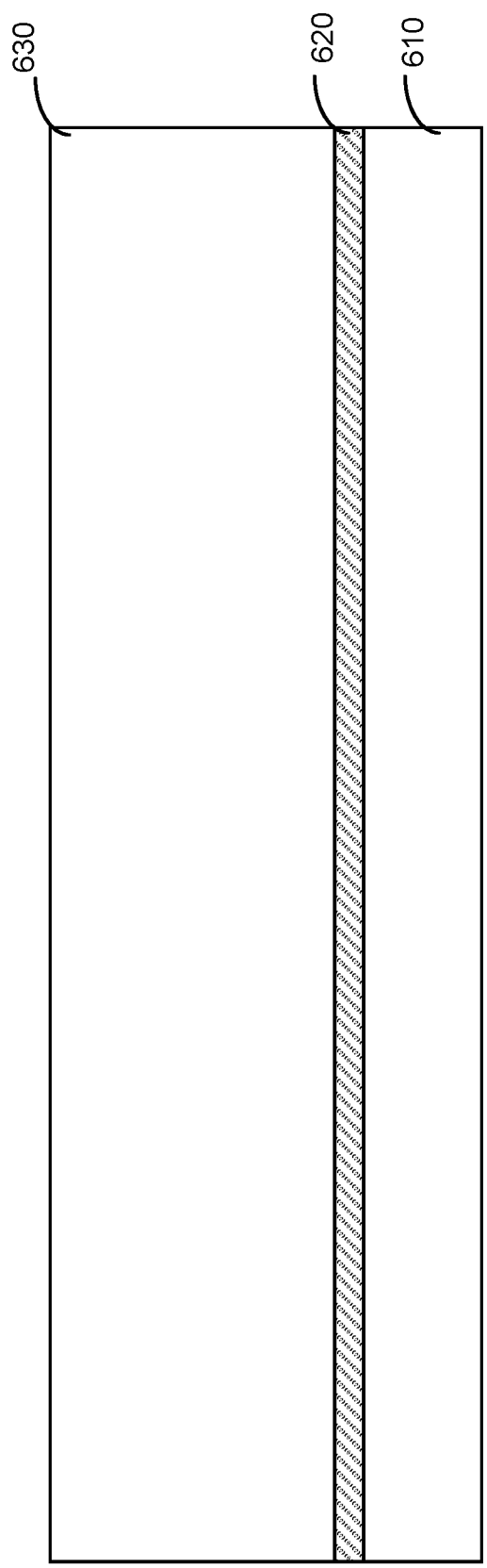
FIGS. 6A through 6I illustrate another example method for incorporating or fabricating multiple isolated power circuits and devices in a monolithic semiconductor die.

FIG. 6A is a cross-sectional sectional view of an example wafer 600 (e.g., silicon wafer) that can be used for the process. Wafer 600 may include a heavily doped p-type silicon substrate wafer (e.g., P+ substrate wafer 610) on which a lightly doped p-type silicon layer (e.g., p– layer 620) may be disposed (e.g., by epitaxial growth). Wafer 600 may further include a heavily doped n-type silicon layer (e.g., (overlayer 630) disposed on p– layer 620. Overlayer 630 may be an epitaxially grown layer on p– layer 620, or may be a portion of a N+ substrate bonded to p– layer 620.

In example implementations, overlayer 630 (like overlayer 530, FIG. 5A) may have a resistivity in a range of about 1.0 to 1.5 mOhm-cm, and a thickness in a range from about 1 μm to greater than tens of μm (e.g., 30 to 50 μm). The p– layer 620 (e.g., lightly doped p– layer) may, for example have a thickness in a range from 0.3 μm to 4 μm (e.g., 1 μm), and the P+ substrate wafer 610 may have a starting thickness in a range of about 300 μm to 950 μm.

Figure 6B:
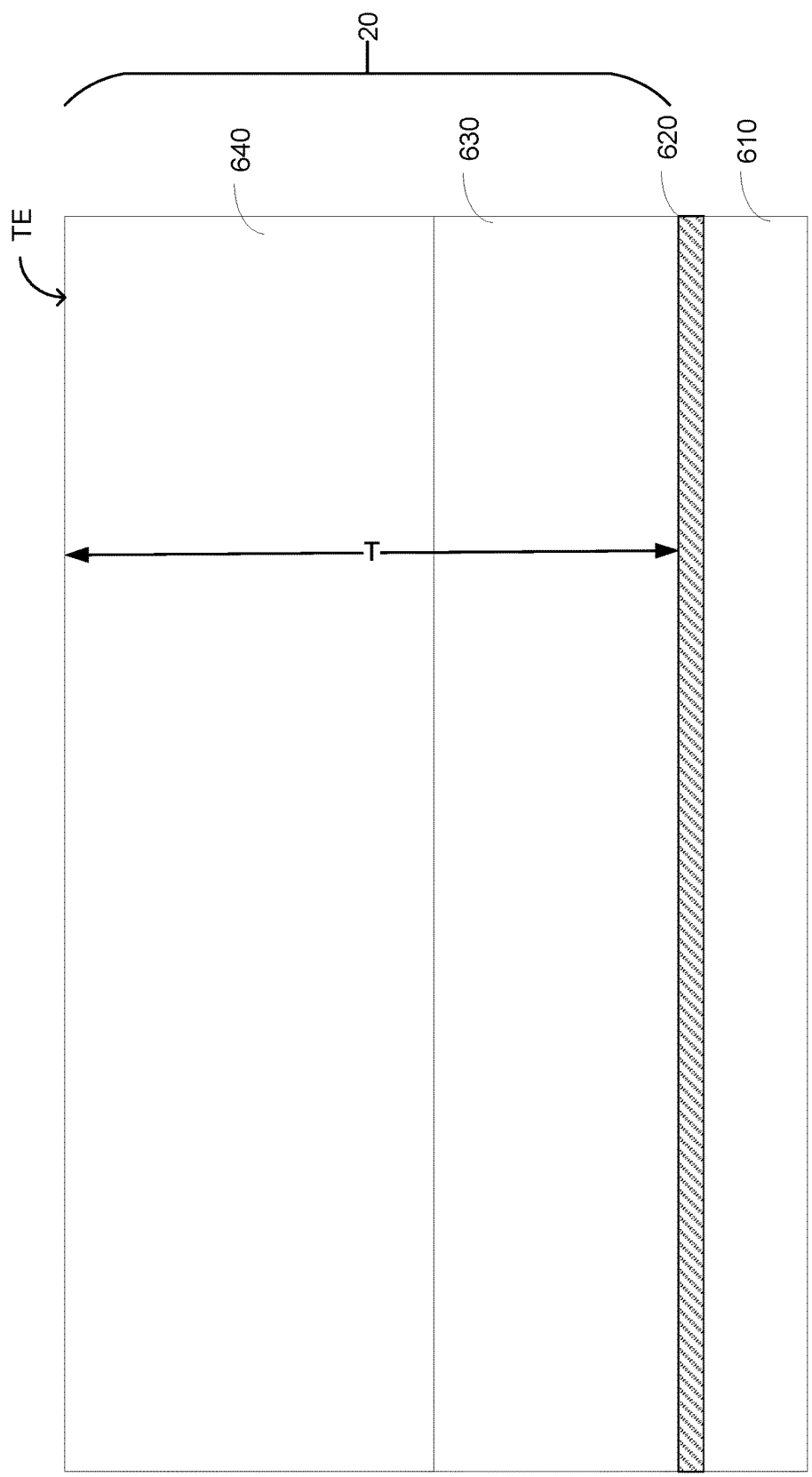

Next as shown in FIG. 6B, an epitaxial layer of silicon (e.g., epi layer 640) may be grown on top of overlayer 630. Epi layer 640 may have a top surface TE. The combined silicon material of overlayer 630 and epi layer 640 lying above p– layer 620 can be referred to as silicon layer 20 (as previously labelled in FIGS. 1-4) in which power circuits and devices may be fabricated. In example implementations, silicon layer 20 may have thickness T of about 30 to 50 μm (e.g., 40 μm).

At next steps in the process, deep trenches (e.g., deep trenches 15) may be etched from top surface TE through epi layer 640 and overlayer 630 to reach the lightly doped p– layer (i.e., p– layer 620). Deep trenches 15 may be formed by dry etch processes that use, for example, the p– layer 620 as an etch stop. The deep trenches 15 may be filled with insulating material 15-1 (e.g., undoped poly silicon, oxide).

Figure 6C:
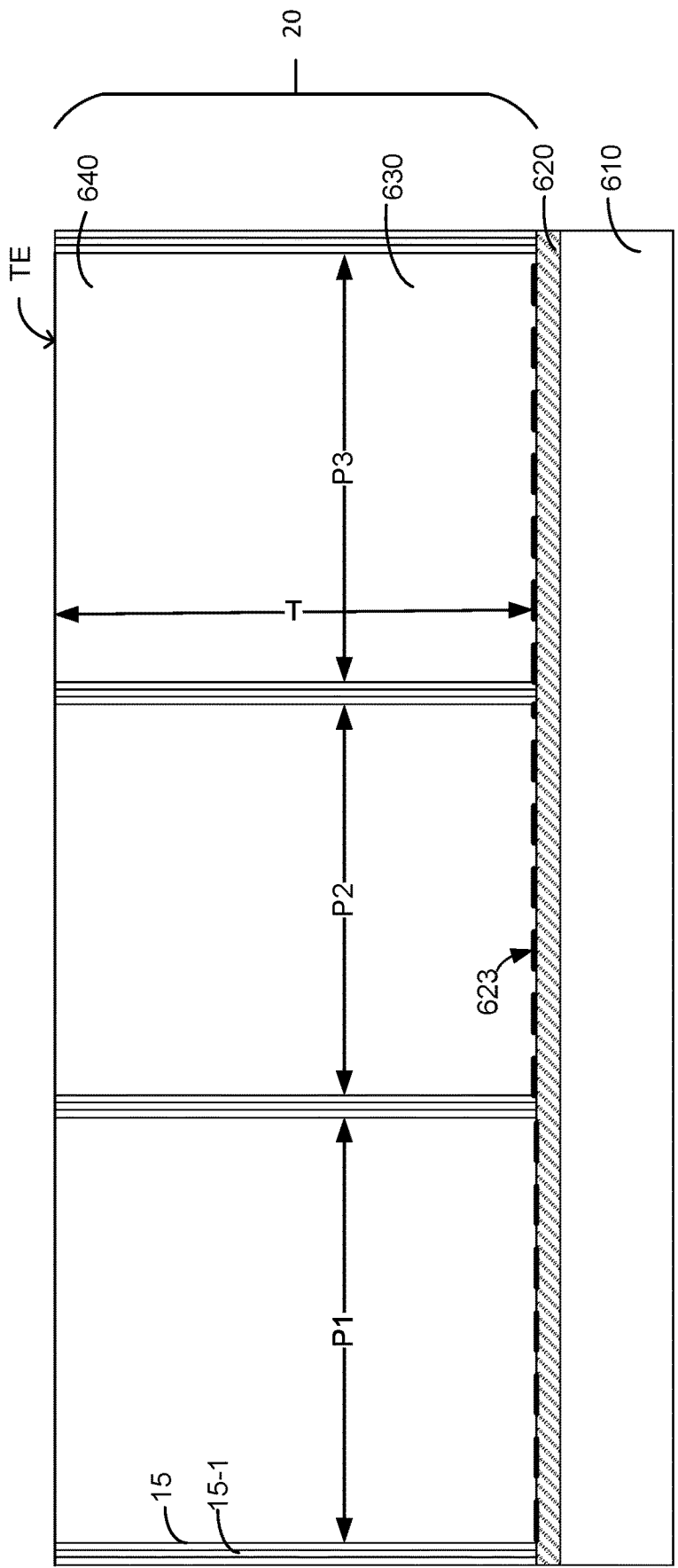

As shown in FIG. 6C, a number n (e.g., n=4) of insulator-filed deep trenches may be fabricated to divide or partition the silicon material of overlayers 630 and epi layer 640 lying above p– layer 620 into a number (e.g., three) isolated pockets (e.g., P1, P2 and P3) of silicon material. Pockets P1, P2 and P3 may be isolated from each other in the horizontal x direction by the deep trenches 15, and from below (e.g., in the vertical y direction) by a p-n junction (e.g., p-n junction 623) formed between p– layer 620 and overlayer 630 (e.g., n-doped overlayer).

At next steps in the process, power circuits and devices may be fabricated in the isolated pockets P1, P2 and P3. For example, as discussed with reference to FIG. 2 high-side driver circuit 11, controller circuit 12, and low-side driver circuit 13 may be fabricated in the isolated pockets (e.g., pockets P1, P2, and P3, respectively). The high-side driver circuit 11 and the low-side driver circuit 13 fabricated in pockets P1 and P3 may include MOSFET devices (e.g., MOSFET 30, FIG. 2). As previously noted (with reference to FIGS. 5C and 5D), industrial integrated circuit and device fabrication processes and techniques (including, e.g., lithographic patterning, dopant implantation and diffusion, etching and deposition of materials, etc.) may be utilized for fabricating the circuits in pockets P1, P2 and P3.

Figure 6D:
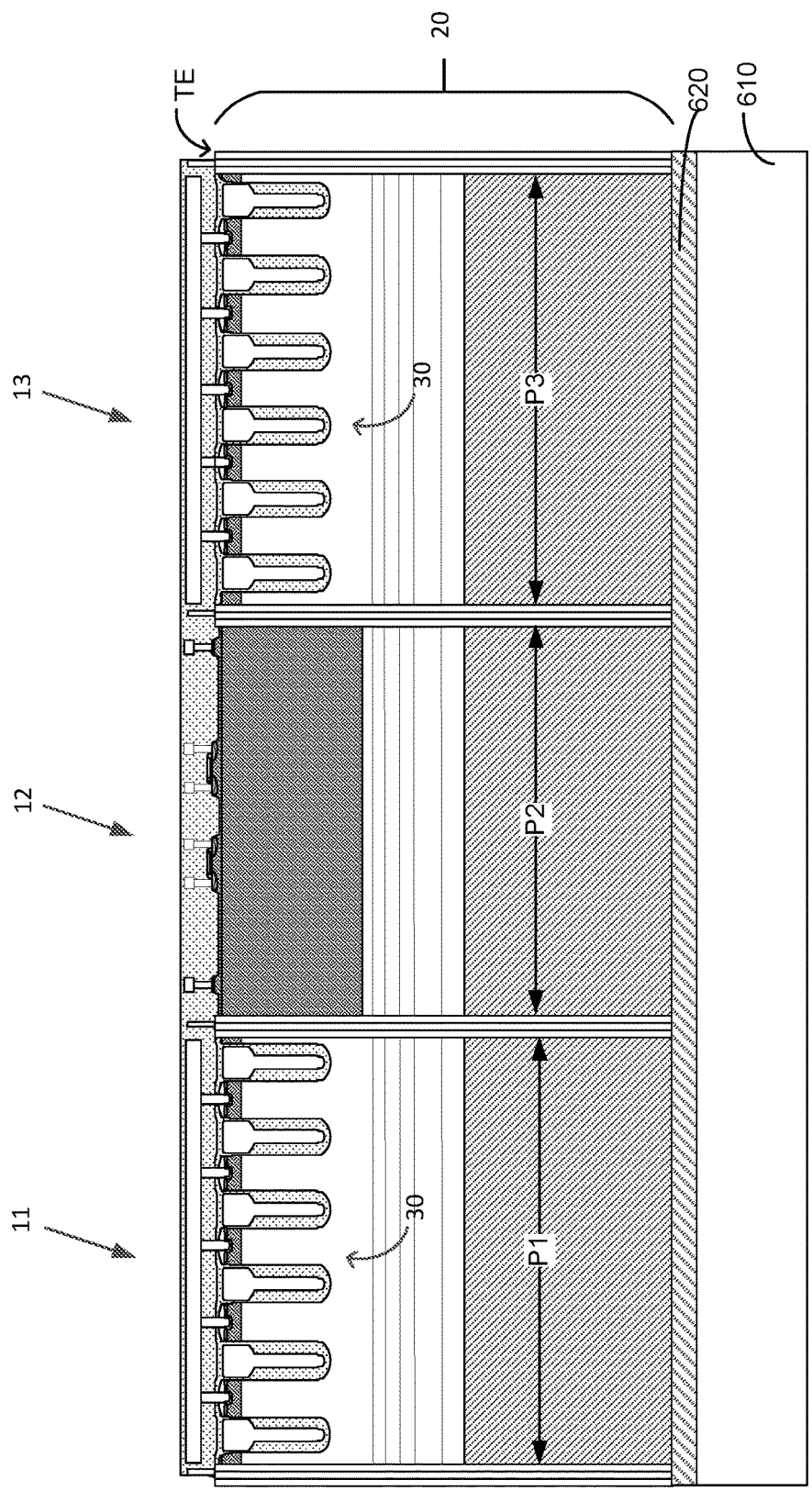

FIG. 6D shows a cross-sectional view of wafer 600 after high-side driver circuit 11, controller circuit 12, and low-side driver circuit 13 have been fabricated in silicon layer 20 in pockets P1, P2, and P3, respectively, above the lightly doped p− layer (i.e., p− layer 620) and the substrate wafer (i.e., P+ substrate wafer 610).

Figure 6E:
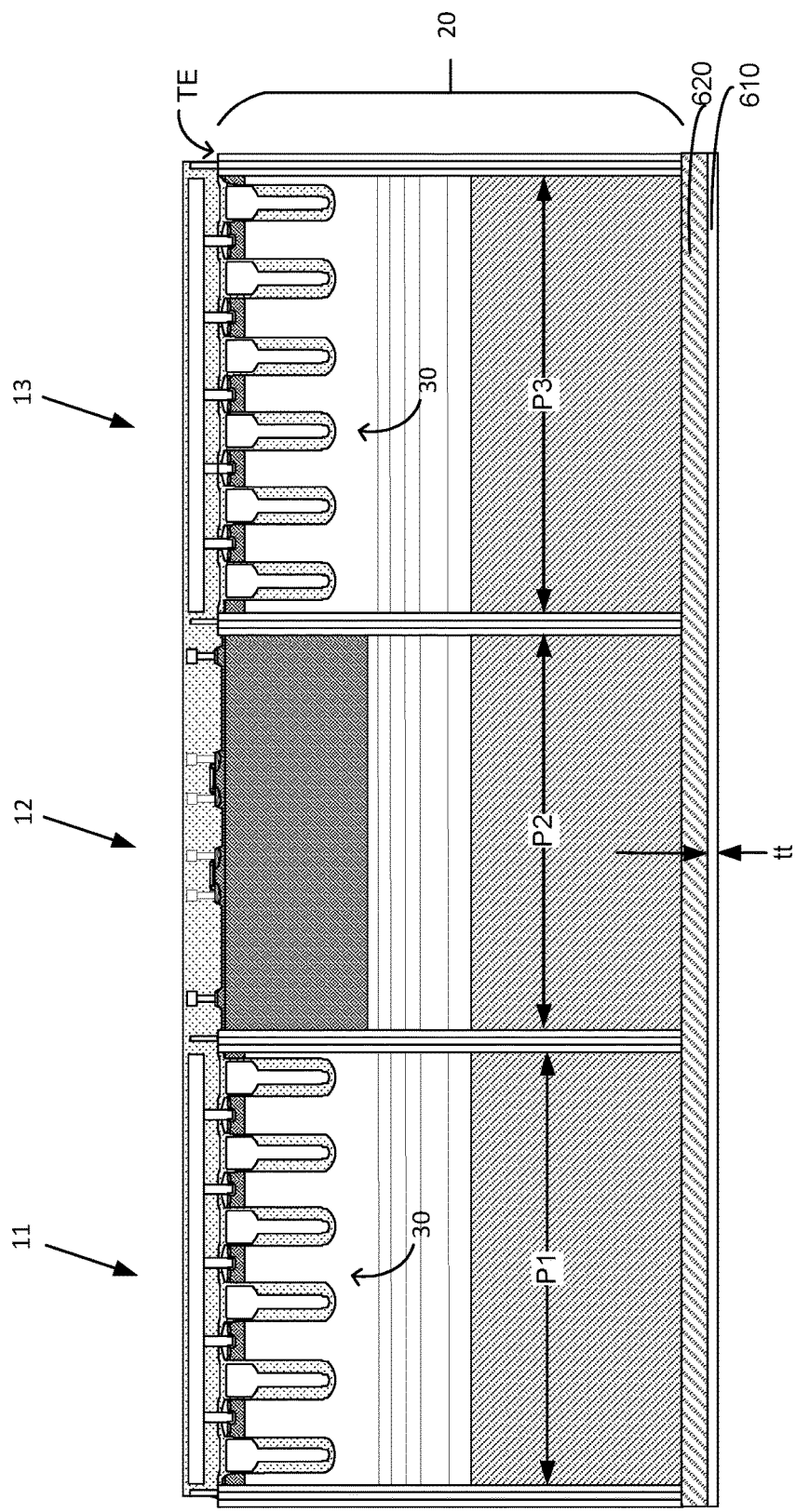
Figure 6F:
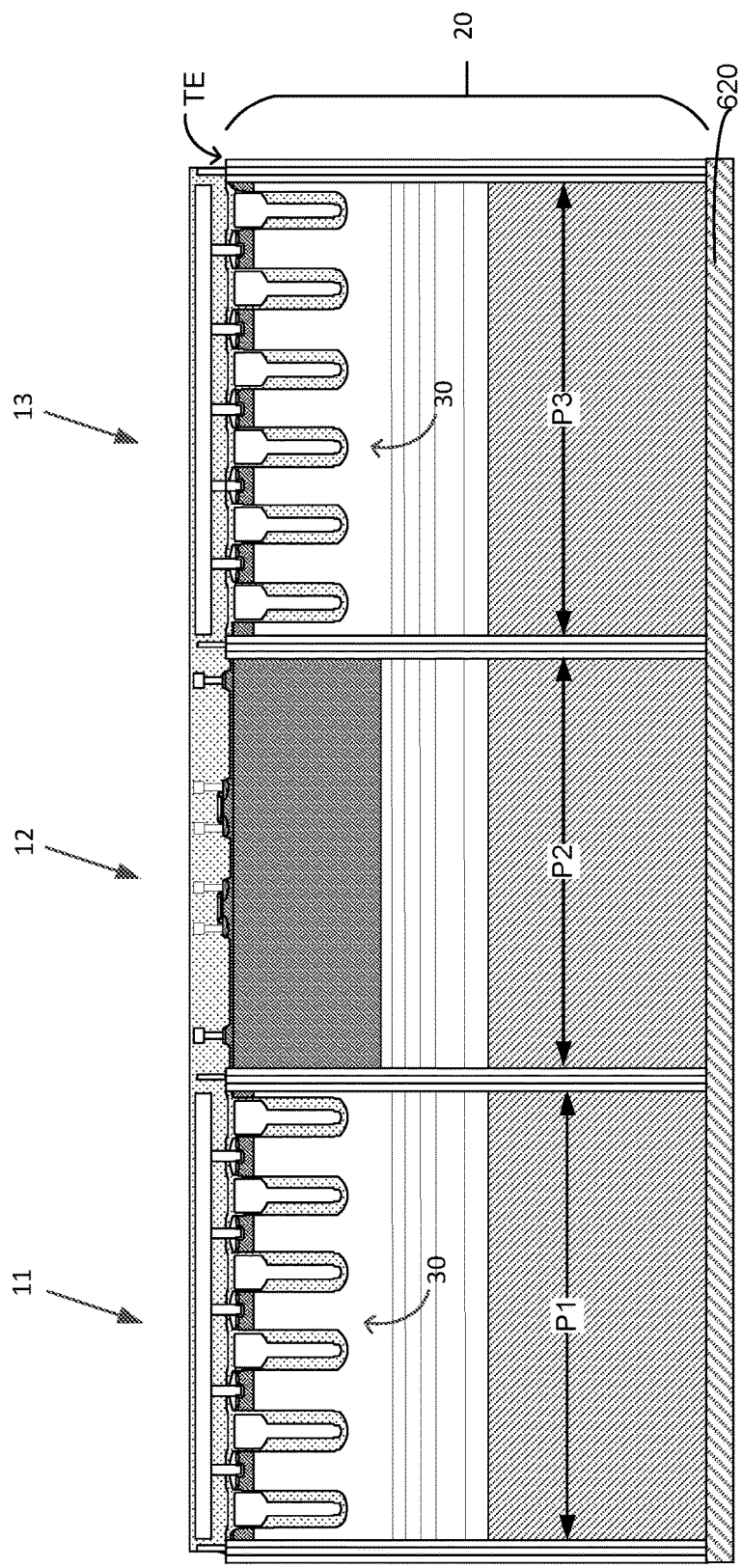

In further steps in the process, back grinding, and polishing or etching techniques may be used to thin the substrate wafer (i.e., P+ substrate wafer 610) to a thickness tt as shown, for example, in FIG. 6E. In example implementations, the thickness tt may be about a few μm or less (e.g., 1-5 μm). Next, as shown in FIG. 6F, the thinned P+ substrate wafer 610 may be completely removed by selective etching (e.g., using a selective etchant such a mixture of hydrofluoric acid, nitric acid and acetic acid (HNA) that preferentially etches the P+ doped material and stops etching at the p− layer 620). Only the p− layer 620 may remain on the backside of wafer 600.

Figure 6G:
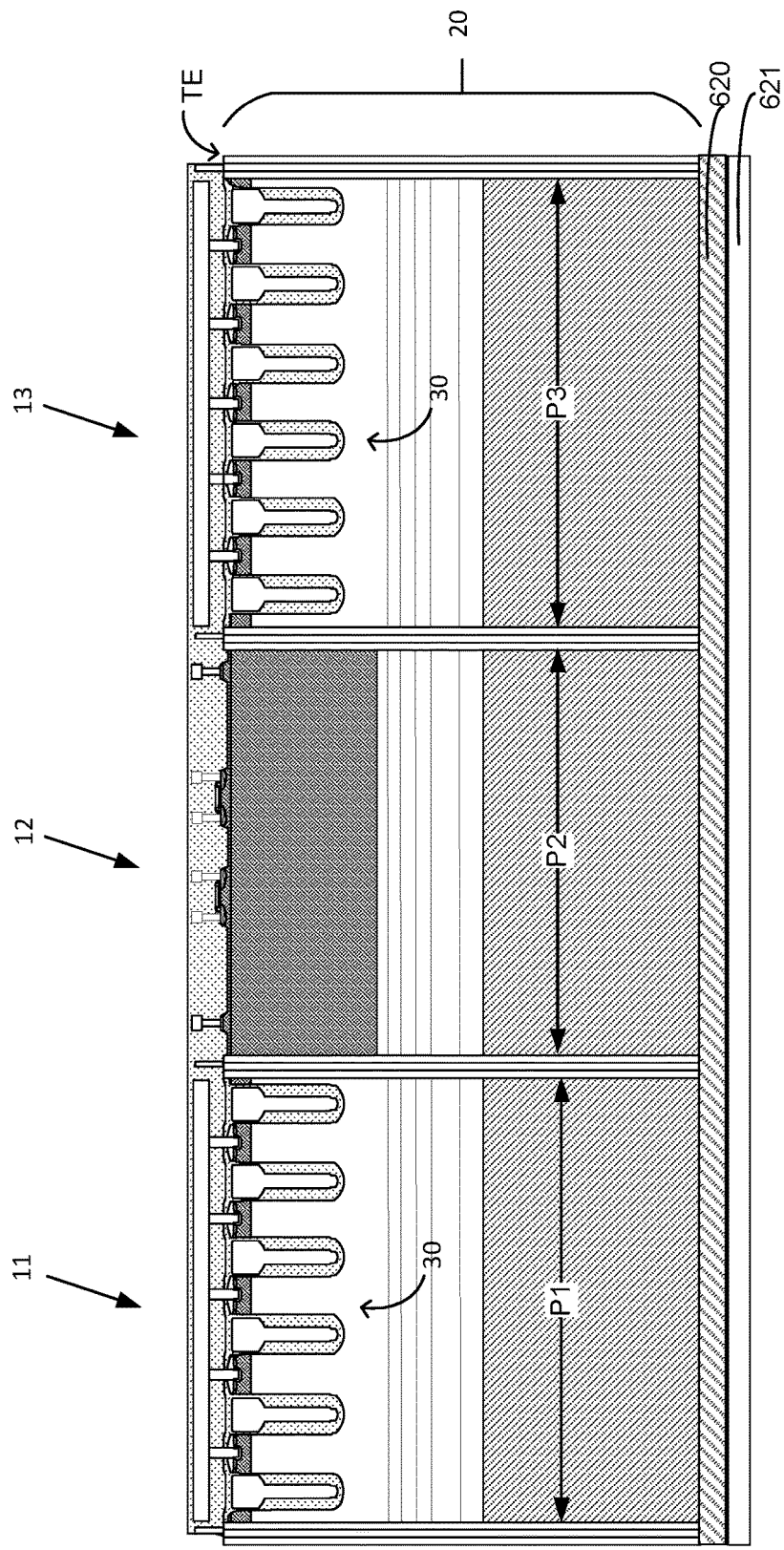

Further in the process, as shown in FIG. 6G, a passivating layer 621 (e.g., a dielectric or silicon oxide layer) may be deposited on the p− layer 620 remaining on the backside of wafer 600.

Figure 6H:
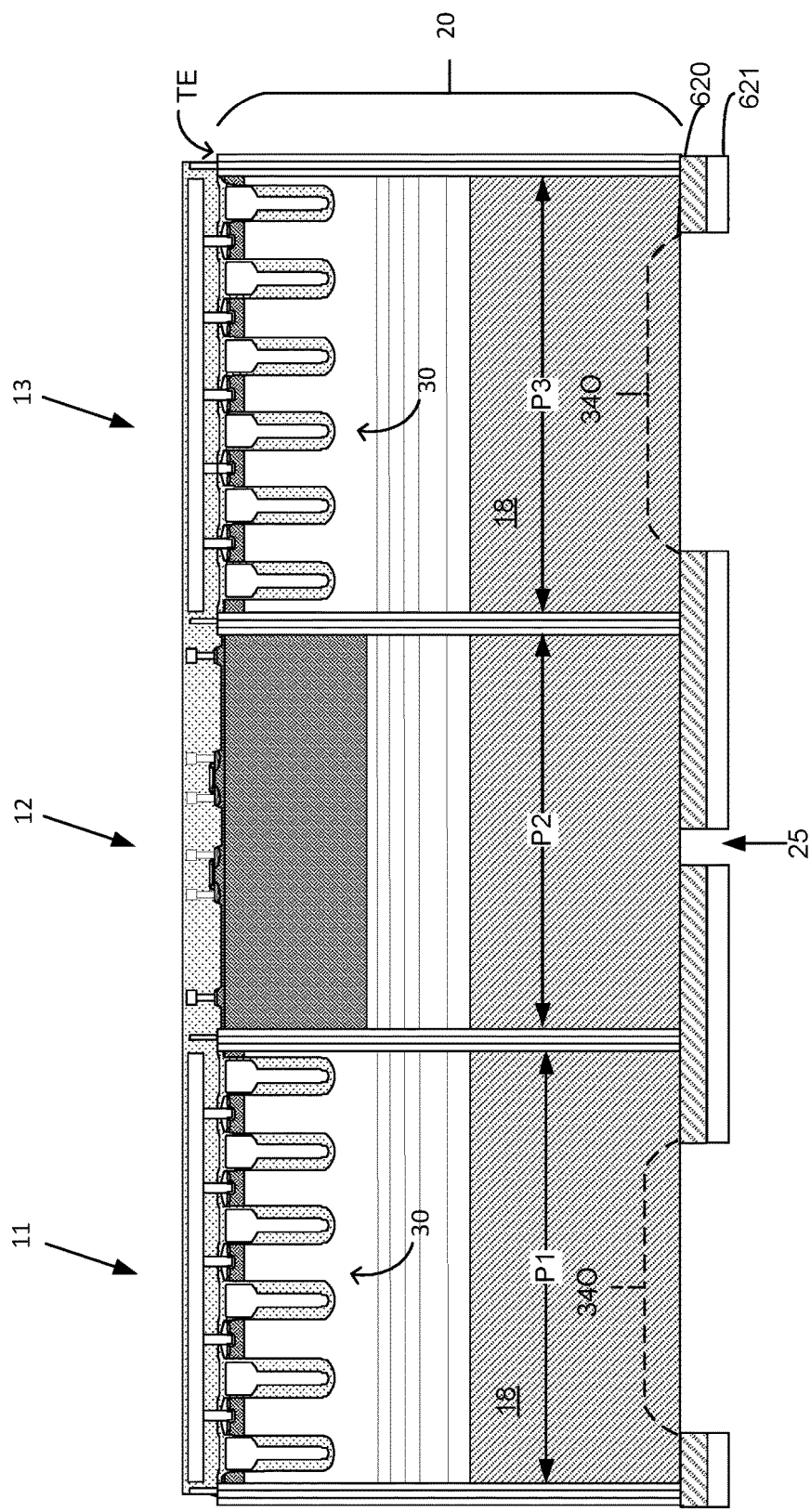
Figure 6I:
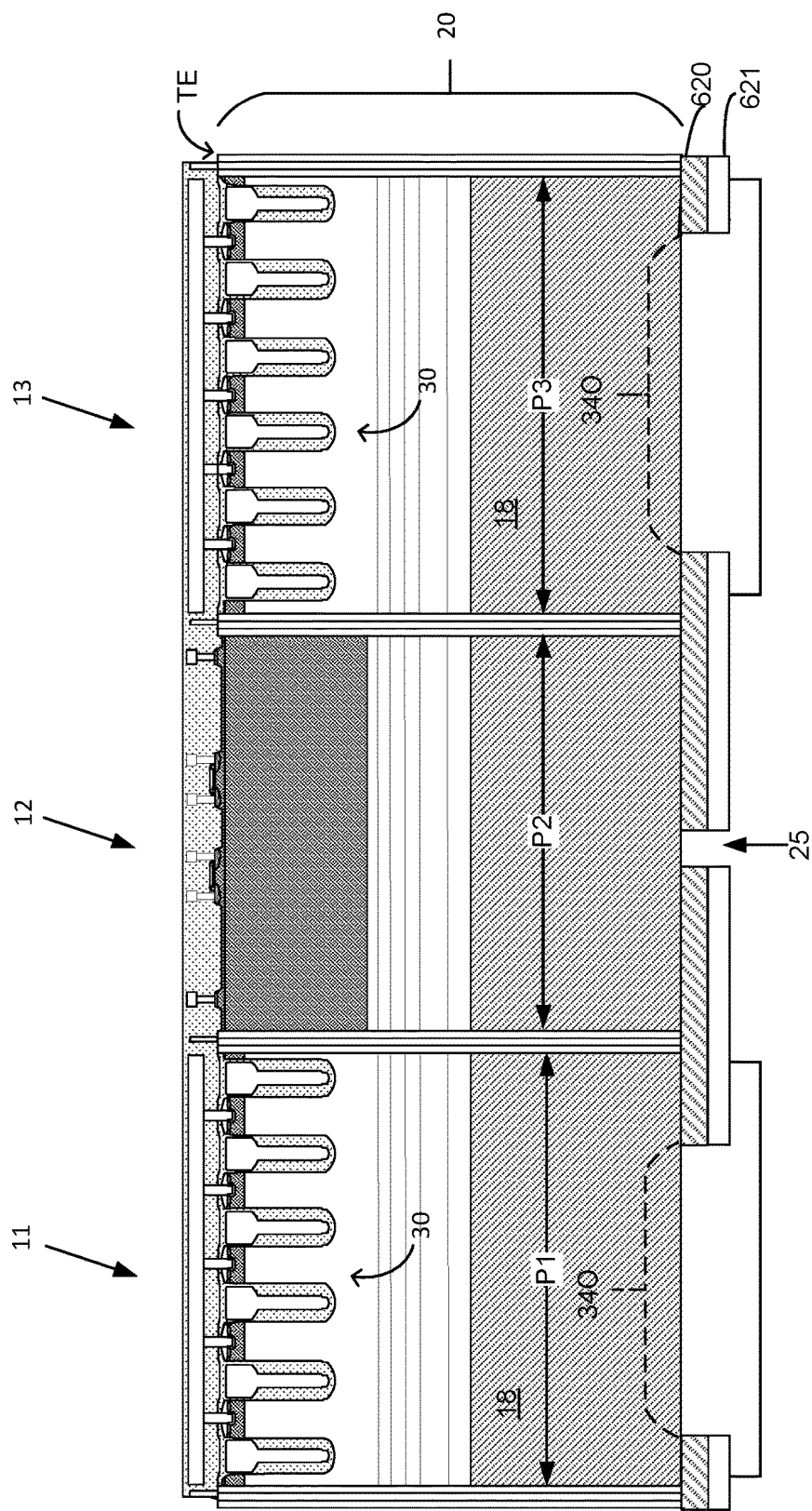

In further process step, as shown in FIG. 6H, for backside connections to the drain regions (e.g., drain region 18) of MOSFETs 30 in pockets P1 and P3, openings 34O can be made in passivating layer 621 and p− layer 620 on the backside of wafer 600. In some implementations, an opening 25 may also be made through passivating layer 621 and p− layer 620 on the backside of wafer 600 for potential connection to the backside of circuit 12 in pocket P2, Openings 34O may be made using, for example, lithographic patterning and etching techniques. Next, the backside of wafer 600 may be metalized to make electrical connection to the drain regions of MOSFETS 30 through openings 34O. For example, as shown in FIG. 6I, conductive material (e.g., conductor 34. a metal or metal alloy) may be deposited on the backside of wafer 600 to make electrical connection to drain regions 18 of MOSFETS 30 through openings 34O.

Wafer 600 may then be diced or singulated (not shown) to obtain monolithic semiconductor die (e.g., monolithic semiconductor die 200, FIG. 2) including the individual power circuits fabricated in isolated pockets of semiconductor material (e.g., high-side driver circuit 11, controller circuit 12, and low-side driver circuit 13 fabricated in isolated P1, P2 and P3, respectively). As discussed above, MOSFET devices (e.g., MOSFET 30) monolithic semiconductor die that are configured in backside drain topology can be fabricated using the process illustrated in FIGS. 6A-6I.

FIG. 7 shows an example method for integrating diverse or different power circuits in a single monolithic semiconductor die. The diverse power circuits may, for example, include one or more of high-side driver circuits, low-side driver circuits, controller circuits, protection circuits, and sensing circuits, etc., The diverse circuits may include one or more of MOSFETs, CMOS, NMOS, and/or PMOS devices fabricated using, for example, CMOS technologies and/or BCD technologies. The high-side driver circuits and low-side driver circuits may include vertical trench shielded gate MOSFETS. The controller circuits may include lateral MOSFETS and other PMOS or NMOS devices.

Method 700 includes forming a plurality of pockets of semiconductor material in a semiconductor substrate, the plurality of pockets being electrically isolated from the semiconductor substrate (block 710). The pockets may be electrically isolated from the semiconductor substrate by at least one of an insulating layer, or a p-n-junction disposed between a backside of the pockets and the semiconductor substrate. The pockets are also generally isolated from each other.

Method 700 further includes forming a metal-oxide-semiconductor field-effect transistor (MOSFET) in a pocket of the plurality pockets, the MOSFET being a vertical trench shielded gate MOSFET (block 720). The MOSFET can have a drain region vertically below a trench and a mesa of the MOSFET.

Method 700 further includes making an electrical connection to the drain region of the MOSFET either from a backside or a top side of the pocket (block 730).

Forming the electrical connection to the drain region of MOSFET from the top side of the pocket (block 730) includes disposing a conductor extending from a drain terminal on the top side of the pocket down through the pocket to the drain region of the MOSFET vertically below the trench and the mesa of the MOSFET.

Method 700 may further include disposing gate poly asymmetrically in the trench to have a separation distance from a first mesa adjacent to the trench that is larger than a separation distance from a second mesa adjacent to the trench.

In method 700, forming the plurality of pockets of semiconductor material in the semiconductor substrate (block 710) includes etching vertical deep trenches down from a top surface of the semiconductor substrate and filling the vertical deep trenches with an insulator, the insulator-filled vertical deep trenches forming sidewalls of the plurality of pockets. Method 700 further includes electrically isolating the plurality of pockets from the semiconductor substrate by at least one of an insulating layer, or a p-n-junction, disposed between a backside of the plurality of pockets and the semiconductor substrate.

In example implementations, method 700 further includes extracting monolithic semiconductor die including more than one different power circuits and devices formed in the plurality of pockets on the semiconductor substrate (block 740).

In example implementations, the semiconductor substrate can be a p− epi substrate. The pockets may be isolated from each other using deep trench isolation (DTI) techniques. Vertical deep trenches (DTI trenches) may be etched from a top surface of the semiconductor substrate and filled with an insulator. The DTI trenches may form sidewalls of each pocket and may isolate the plurality of pockets from each other in directions parallel to the top surface. The semiconductor material in each pocket may include a semiconductor material layer of vertical thickness T (e.g., equal to about a depth of the DTI trenches). Each pocket of semiconductor material may have a bottom surface or backside (generally parallel to the top surface). A pocket may be electrically isolated (or at least partially isolated) in a vertical direction (e.g., a direction orthogonal to the bottom surface or backside) from the external environment outside the pocket (e.g. from the remaining semiconductor substrate). One or more of an insulating layer (e.g., an oxide layer) and a p-n junction (disposed generally parallel to the bottom surface) may electrically isolate the pocket in the vertical direction.

In method 700, forming a MOSFET in a pocket of the plurality pockets (block 720) may include fabricating vertical trench shielded gate MOSFET in the pocket.

Forming the MOSFET may include performing a deep n-type buried layer (NBL) implantation and an implant activation drive in the one of the plurality isolated pockets (e.g., to prepare dopant concentration profiles for the MOSFET's drift region and drain region (e.g., drain region 18, FIGS. 1-4) of the MOSFET device).

Metal contacts or connections to the source and gate regions of the one MOSFET may be made on a top side of the first pocket.

Method 700 further includes forming an electrical connection or contact to a drain region vertically below a trench and a mesa of the MOSFET either from a backside of the first pocket, or from a top side of the first pocket (block 730).

In example implementations, forming the electrical connection (i.e., contact) to the drain region of the MOSFET from the backside of the pocket may making an opening in an insulating layer on the backside of the pocket and depositing conducting material in the opening to contact the drain region of MOSFET.

In example implementations, forming the electrical connection (i.e., contact) to the drain region of the MOSFET from the backside of the pocket may making an opening in an insulating layer on the backside of the pocket may include forming a blind through-silicon via (BTSV) from a backside of the semiconductor substrate reaching into the drain region of the MOSFET and depositing conducting material in the BTSV to make the electrical connection to the drain region of MOSFET.

In example implementations, forming the electrical connection (i.e., contact) to the drain region of the MOSFET from the backside of the pocket may include thinning the semiconductor substrate and forming a partial or blind through-silicon via (BTSV) to access the drain region of the MOSFET from the backside of the thinned semiconductor substrate. The BTSV may have a depth D (from the backside of the thinned semiconductor substrate) sufficient to reach into the pocket and access the drain region of the MOSFET. A layer of insulating material (e.g., an oxide, nitride, or alumina) may be deposited on sidewalls of the BTSV (and on the backside of the thinned semiconductor substrate) to isolate the BTSV from the substrate. Making the contact to the drain region of the MOSFET from the backside may further include filling the BTSV with conductive material (e.g., a metal, or metal alloy), or depositing (e.g., plating) a conductive material layer on the sidewalls of the BTSV, to electrically connect to the drain region of the MOSFET from the backside.

In some example implementations, making the contact to the drain region of the at least one MOSFET from the top side of the first pocket may include disposing a drain conductor extending from a drain terminal on the top side down through at least one vertical mesa (e.g., a drain mesa) to reach the drain region of the MOSFET. The drain region of the MOSFET is vertically underneath or below the mesas (and trenches 31T) of the MOSFET. The drain mesa may not include source of body regions or the source and body regions in the drain mesa may not be used (e.g., no source connection may be made to the drain mesa) for transistor functions of the MOSFET. A source mesa (i.e., a mesa with source and body regions supporting transistor action in a gate channel) may be on an opposite side of a trench (e.g., trench 31T) than the drain mesa. In example implementations, gate poly (e.g., a gate electrode) may be disposed asymmetrically in the inter-mesa trench to be at a smaller separation distance from the source mesa and at a larger separation distance from the drain mesa. Corresponding to the larger separation distance, a thicker insulating dielectric layer (e.g., silicon oxide layer) may be disposed between the gate poly and the drain mesa than between the gate poly and the source mesa.

In example implementations, at least one MOSFET fabricated in a respective one of the plurality isolated pockets may be a first MOSFET fabricated in a first pocket, and method 700 may further include fabricating a second MOSFET in second pocket. The first MOSFET may, for example, be part of a high side driver circuit, and the second MOSFET may, for example, be part of a low side driver circuit.

In some example implementations, the first MOSFET and the second MOSFET may both have backside drain contact topologies. In some example implementations, the first MOSFET and the second MOSFET may both have top side drain contact topologies. In some example implementations, the first MOSFET may a have backside drain contact topology and the second MOSFET may an opposite side drain contact topology i.e., a top side drain contact topology.

Method 700 may further include fabricating a controller circuit in a third pocket. The controller circuit may include, for example, CMOS, PMOS and or NMOS devices (e.g., lateral CMOS devices) fabricated using CMOS and or BCD technologies.

In example implementations, method 700 may further include extracting monolithic semiconductor die including more than one different power circuits fabricated in the isolated pockets of the semiconductor substrate (block 740). An example monolithic semiconductor die (e.g., monolithic semiconductor die 100, 200, 300, or 400) may, for example, include a high-side driver circuit fabricated in a first isolated pocket, a controller circuit fabricated in a second isolated pocket, and a low-side driver circuit fabricated in a third isolated pocket. The monolithic semiconductor die may be extracted, for example, by dicing or singulation of the semiconductor substrate.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques.

Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor die, comprising:
a semiconductor material layer having a top surface and a backside surface;
an insulating layer disposed on the backside surface of the semiconductor material layer;
a plurality of insulator-filled trenches extending vertically through a thickness of the semiconductor material layer from the top surface to the insulating layer, the plurality of insulator-filled trenches partitioning the semiconductor material layer into a plurality of pockets, the plurality of insulator-filled trenches defining sidewalls of the plurality of pockets; and
at least one device formed in at least one of the plurality of pockets having a backside contact to a drain region, the backside contact being disposed in an opening in the insulating layer.

2. The semiconductor die of claim 1, wherein the backside contact to the drain region includes a conductive material disposed in the opening in the insulating layer disposed on the backside surface of the semiconductor material layer.

3. The semiconductor die of claim 1, wherein the semiconductor material layer includes an epitaxial layer with n-type dopants.

4. The semiconductor die of claim 1, wherein the at least one device is a first vertical trench metal-oxide semiconductor field effect transistor (MOSFET) disposed in a first pocket from the plurality of pockets, and the semiconductor die further comprises:
a second vertical trench MOSFET disposed in a second pocket from the plurality of pockets.

5. The semiconductor die of claim 1, wherein the at least one device includes a CMOS device of a controller circuit.

6. The semiconductor die of claim 1, wherein the at least one device includes a CMOS device of a controller circuit formed in a pocket from the plurality of pockets.

7. The semiconductor die of claim 6, wherein the opening in the insulating layer provides a backside access to the CMOS device of the controller circuit formed in the pocket from the plurality of pockets.

8. A semiconductor die, comprising:
a semiconductor material layer having a top surface and a backside surface;
a plurality of insulator-filled trenches extending vertically through a thickness of the semiconductor material layer from the top surface to the backside surface, the plurality of insulator-filled trenches partitioning the semiconductor material layer into a plurality of pockets, the plurality of insulator-filled trenches defining sidewalls of the plurality of pockets;
at least one device formed in at least one of the plurality of pockets including a transistor having a backside contact a drain region; and
an insulating layer disposed below the transistor.

9. The semiconductor die of claim 8, wherein:
the semiconductor material layer includes a p-type doped semiconductor layer disposed on or at the backside surface, an n-type doped layer is disposed on the p-type doped semiconductor layer, and an epitaxial layer with n-type dopants is disposed on the n-type doped layer,
the insulating layer is disposed underneath the p-type doped semiconductor layer on or at the backside surface of the semiconductor material layer, and
the plurality of insulator-filled trenches extend vertically down through a thickness of the semiconductor material layer from the top surface to the p-type doped semiconductor layer disposed on or at the backside surface of the semiconductor material layer, the plurality of pockets being electrically connected to each other by the p-type doped semiconductor layer disposed on or at the backside surface of the semiconductor material layer.

10. The semiconductor die of claim 8, wherein:
the semiconductor material layer is formed in an epitaxial layer on a substrate of a first conductive type, and a buried conductive layer of a second conductive type is disposed on or at about the backside surface of the semiconductor material layer, and
the plurality of insulator-filled trenches extend vertically down from the top surface to below the buried conductive layer of the second conductive type, the plurality of pockets being electrically isolated from the substrate of the first conductive type in vertical directions by a p-n junction formed between the buried conductive layer of the second conductive type and the substrate of the first conductive type.

11. The semiconductor die of claim 10, wherein the substrate of the first conductive type is a thinned substrate and a blind through-silicon via (BTSV) extends from a backside of the thinned substrate into at least one of the plurality of pockets.

12. The semiconductor die of claim 11, wherein the insulating layer is disposed on the backside of the thinned substrate and on sidewalls of the BTSV, and wherein a conductive material deposited in, or deposited on the sidewalls of, the BTSV makes the backside contact through the BTSV to the drain region of the transistor.

13. The semiconductor die of claim 12, wherein the transistor is a first vertical trench MOSFET in a first pocket from the plurality of pockets, and the semiconductor die further comprises:
a second vertical trench MOSFET in a second pocket from the plurality of pockets.

14. The semiconductor die of claim 8, wherein:
the semiconductor material layer is formed in an epitaxial silicon layer on a substrate, and a buried layer is disposed on or at about the backside surface of the semiconductor material layer,
the plurality of insulator-filled trenches extend vertically down from the top surface to the backside surface of the semiconductor material layer below the buried layer, the plurality of pockets being electrically isolated from the substrate in vertical directions by a p-n junction formed between the buried layer and the substrate, the at least one device includes a vertical trench MOSFET fabricated in a pocket of the plurality of pockets, and at least one conductor extending from a drain terminal on a top side of the pocket down through the pocket to contact the drain region below a plurality of vertical trenches and mesas of the vertical trench MOSFET.

15. The semiconductor die of claim 14, wherein the at least one conductor extending from the drain terminal on the top side of the pocket down through the pocket passes through a mesa of the plurality of vertical trenches and the mesas of the vertical trench MOSFET formed in the pocket.

16. The semiconductor die of claim 15, wherein gate poly is disposed asymmetrically in a first trench next to the mesa to have a separation distance from the mesa that is larger than a separation distance from a second mesa adjacent to the first trench.

17. The semiconductor die of claim 15, wherein gate poly is disposed symmetrically in a first trench next to the mesa to have a separation distance from the mesa that is about a same as a separation distance from a second mesa adjacent to the first trench.

18. A semiconductor die, comprising:
a semiconductor material layer having a top surface and a backside surface;
an insulating layer disposed on the backside surface of the semiconductor material layer;
an insulator-filled trench extending vertically through a thickness of the semiconductor material layer from the top surface to the insulating layer disposed on the backside surface of the semiconductor material layer, the insulator-filled trench partitioning the semiconductor material layer into at least two pockets; and
at least one of the at least two pockets including a transistor having a backside contact to a drain region, the backside contact being disposed in an opening in the insulating layer.

19. The semiconductor die of claim 18, wherein the backside contact to the drain region includes a conductive material disposed in the opening in the insulating layer disposed on the backside surface of the semiconductor material layer.

20. The semiconductor die of claim 18, wherein the transistor includes at least one of a complementary metal-oxide semiconductor device of a controller circuit or a vertical trench metal-oxide semiconductor field effect transistor.

* * * * *